United States Patent
Thurmaier et al.

(10) Patent No.: US 9,519,023 B2
(45) Date of Patent: Dec. 13, 2016

(54) MODULE FOR EXCHANGING AN INTERFACE UNIT IN A TESTING SYSTEM FOR TESTING SEMICONDUCTOR COMPONENTS AND TESTING SYSTEM COMPRISING SUCH A MODULE

(71) Applicant: TURBODYNAMICS GMBH, Riedering (DE)

(72) Inventors: Stefan Thurmaier, Au/Bad Feilnbach (DE); Benno Stigloher, Kolbermoor (DE)

(73) Assignee: Turbodynamics GmbH, Riedering (DE)

( * ) Notice: Subject to any disclaimer, the term of this patent is extended or adjusted under 35 U.S.C. 154(b) by 156 days.

(21) Appl. No.: 14/398,058

(22) PCT Filed: May 2, 2013

(86) PCT No.: PCT/EP2013/059151
§ 371 (c)(1),
(2) Date: Oct. 30, 2014

(87) PCT Pub. No.: WO2013/164407
PCT Pub. Date: Nov. 7, 2013

(65) Prior Publication Data
US 2015/0123685 A1     May 7, 2015

(30) Foreign Application Priority Data

May 3, 2012    (DE) ......................... 10 2012 103 893

(51) Int. Cl.
*G01R 31/20*    (2006.01)
*G01R 31/28*    (2006.01)
*G01R 31/26*    (2014.01)

(52) U.S. Cl.
CPC ....... *G01R 31/2889* (2013.01); *G01R 31/2601* (2013.01); *G01R 31/2887* (2013.01)

(58) Field of Classification Search
CPC .............. G01R 1/0408; G01R 31/2601; G01R 31/2891

See application file for complete search history.

(56) References Cited

U.S. PATENT DOCUMENTS

| 5,923,180 A | 7/1999 | Botka et al. |
| 7,196,508 B2 * | 3/2007 | Ham ................ G01R 31/2893 324/756.02 |

(Continued)

FOREIGN PATENT DOCUMENTS

| DE | 19752229 A1 | 8/1998 |
| DE | 10205115 B4 | 8/2003 |

(Continued)

OTHER PUBLICATIONS

English Translation of the International Preliminary Report on Patentability dated Nov. 4, 2014 in corresponding International Patent Application No. PCT/EP2013/059151 filed May 2, 2013.

*Primary Examiner* — Tung X Nguyen
(74) *Attorney, Agent, or Firm* — Rankin, Hill & Clark LLP

(57) ABSTRACT

The invention relates to a module for exchanging an approximately planar interface unit in a testing system for testing semiconductor elements. The module includes a base element, a holder, and guide elements. The guide elements are embodied so that the interface unit can be moved by means of a linear, translatory movement from an end position into an intermediate position and from the intermediate position into a removal position that is situated outside the testing system. The mechanism includes a lever mechanism that is controlled by a sliding guide and is supported so that it can move crosswise to the linear translation movement of the holder.

23 Claims, 22 Drawing Sheets

(56) References Cited

U.S. PATENT DOCUMENTS

Figure 1:
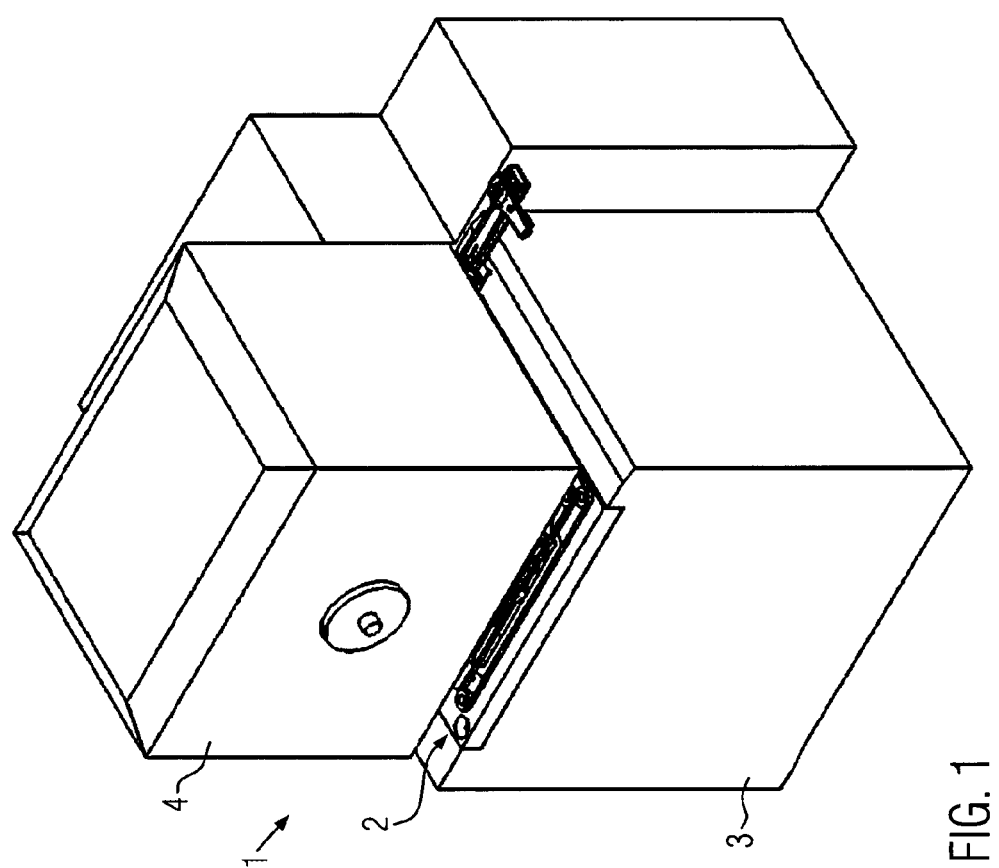

| | | | |
|---|---|---|---|
| 7,355,425 B2 * | 4/2008 | Yamada | ............... G01R 1/0408 324/750.19 |
| 2003/0194821 A1 | 10/2003 | Chiu et al. | |
| 2009/0102456 A1 | 4/2009 | Vayner et al. | |
| 2012/0187973 A1 | 7/2012 | Makita et al. | |

FOREIGN PATENT DOCUMENTS

| | | |
|---|---|---|
| EP | 1495339 B1 | 10/2007 |
| EP | 1995602 A1 | 11/2008 |
| JP | 09-159730 A | 6/1997 |
| WO | 97/22886 A1 | 6/1997 |
| WO | 2011/145244 A1 | 11/2011 |

\* cited by examiner

MODULE FOR EXCHANGING AN INTERFACE UNIT IN A TESTING SYSTEM FOR TESTING SEMICONDUCTOR COMPONENTS AND TESTING SYSTEM COMPRISING SUCH A MODULE

The present invention relates to a module for exchanging an interface unit in a testing system for testing semiconductor elements and a testing system with such a module.

JP 9 159 730 A has disclosed a testing device for testing semiconductor elements in which a performance board is coupled to a test head in such a way that it can be pulled out laterally from the test head like a drawer. The performance board has guide holes through which guide pins of the test head extend in order to position the board. The performance board can be easily exchanged by pulling it out laterally.

EP 1 495 339 B1 and US 2003/019 4821 A1 have disclosed another testing device for testing semiconductor elements in which a subassembly supporting an interface unit is attached to the test system in a pivoting fashion. The pivoting arrangement of the subassembly makes it possible to easily remove the interface unit from the test system and exchange it. Preferably, a telescope-like extending device is provided on the subassembly, permitting the interface unit to be pulled out from the region of the test system.

DE 102 05 115 B4 discloses a coupling device that is embodied to connect a first plate, which is fastened to a testing device for electronic components, to a second plate, which is fastened to a handling device for electronic components. A feeder frame is guided on the first plate in a way that permits it to move perpendicular to a plane of the plate. The second plate is connected to an additional coupling device in the form of an auxiliary frame situated in its edge region. The second plate can be detachably coupled to the feeder frame via this auxiliary frame. On each of two opposing sides, the auxiliary frame has two respective detent projections extending outward, which can be inserted into corresponding sliding guides of the feeder frame, and by sliding the auxiliary frame parallel to the plane of the feeder frame, can engage in detent fashion with these corresponding sliding guides in a precisely defined position. The actuation takes place by means of a drive belt.

DE 197 52 229 A1 describes a flexible coupling adapter for a wafer tester. In this case, a test head is mounted on a truck. The test head is mounted on the truck by means of pivoting connections. The pivoting connections permit the test head to be positioned in an upward-oriented position so that a loading plate and a calibration or fastening plate as well as a DUT plate can be attached to the test head of an electronic circuit tester by means of a socket. The test head can be pivoted into various angled positions so that the socket constitutes an interface with an automated material handling device. In order to produce an interface between the socket and the automated material handling device or a disk tester of a wafer testing station, a frame can be attached to the test head. A clamping device that corresponds to the frame is mounted onto the automated material handling device or the wafer testing station in order to align the test head in relation to the handling device or the station so that the socket or a wafer probe contacts the component or circuit to be tested.

A testing system is also known in which the interface unit can be pulled out and pushed in by means of a drawer; in the retracted position of the drawer, the interface unit is moved into an end position with a linear motion perpendicular to the plane of the interface unit. The movement into the end position is actuated by means of pneumatic cylinders and is executed automatically. Additional pneumatic cylinders are also provided for locking unit in the end position. This device is very advantageous in comparison to the device known from EP 1 495 339 B1 because the interface unit is brought into the end position with a linear motion. With the pivoting motion known from EP 1 495 339 B1, there is a significant risk of damage to the contact pins of the testing system and of the interface unit or to alignment pins that engage in corresponding alignment holes in the interface unit. The complex trajectory of the interface unit as it is moved in and out from the testing system requires a number of cylinder/piston units that can be pneumatically actuated independently of one another. This mechanism does in fact permit a safer exchange of interface units without damage to the contact pins and a user can carry out the exchange quickly with few movements. This device, however, is significantly more costly than the device known from EP 1 495 339 B1.

The object of the invention is to create a module for exchanging an approximately planar interface unit in a testing system for testing semiconductor elements, which permits a safe and reliable exchange of the interface unit without damaging contact pins or alignment pins and which is nevertheless inexpensively designed and essentially maintenance-free.

The object is attained by means of a module having the features of claim 1. Advantageous embodiments of the invention are disclosed in the dependent claims.

The module according to the invention for exchanging an approximately planar interface unit in a testing system for testing semiconductor elements includes a base element that can be fastened to the testing system,
a holder for accommodating an interface unit,
guide elements with which the holder is fastened to the base element in such a way that the holder can be moved between an end position on the base element and a removal position; in the end position, the interface unit is situated in an interface plane and the guide elements for guiding the holder along a predetermined trajectory include
at least one lever mechanism that is designed at least for guiding a linear translation movement of the holder a certain distance in the direction perpendicular to the interface plane starting from the end position,
at least one sliding guide for actuating the lever mechanism, with the sliding guide being supported so that it is able to move in a direction crosswise to the linear translation movement of the interface unit, and
an actuating means for moving the sliding guide so that the lever mechanism is actuated.

The module can be fastened by means of its base element to a testing system. As a rule, testing systems for testing semiconductor elements include a testing unit ("tester") and a handling unit ("handler" or "prober"). The testing unit includes a test head, which is used to contact the semiconductor elements to be tested, and is equipped with evaluation electronics. The handling unit includes elements by means of which the semiconductor elements to be tested are supplied to a testing unit. In order for such a testing system to be able to test different semiconductor elements, an interface unit is provided, which is situated in the region of the interface between the testing unit and the handling unit and has contact elements for contacting the electrical semiconductor elements to be tested. The contact elements are respectively arranged in a pattern that is specific to the semiconductor elements to be tested in order to be able to correctly contact the contact points of the semiconductor elements. Depending on the testing system, this interface unit must be fastened either to the testing unit or to the handling unit. Instead of fastening the interface unit directly to the testing unit or handling unit, the module according to the invention is fastened by means of the base element to the testing unit or handling unit.

The interface unit is an approximately planar component that is usually composed of a rigid circuit board. The contact pins and the electrical components integrated into the interface unit can protrude from this circuit board. When the testing system is used, the interface unit must be situated in a particular position in the testing unit or in the handling unit of the testing system. The plane that contains the approximately planar interface unit in its position during use is referred to below as the interface plane. The module according to the invention is designed so that the base element fastened to the testing system, by means of corresponding guide elements, makes it possible to move the interface unit into an end position situated in the interface plane.

The guide elements of the module are designed so that the interface unit can be moved between this end position and a removal position, with the holder for holding the interface unit being guided along a predetermined trajectory. This trajectory includes at least one linear translation movement starting from the end position for a certain distance perpendicular to the interface plane. This linear segment of the predetermined trajectory is guided by means of a lever mechanism. The guide elements also include at least one sliding guide, which is supported so that it can move crosswise to the linear translation movement of the holder. The sliding guide can be moved with an actuating means, with the sliding guide engaging the lever mechanism so that the lever mechanism is actuated when the sliding guide is moved.

Preferably, the sliding guide is designed to lock the lever mechanism in the end position.

Preferably, the module has two lever mechanisms that engage on opposite respective sides of the holder and can each be actuated by means of a sliding guide.

The actuating means for moving the sliding guide is preferably an endless drive belt. Such a drive belt can be a toothed belt, a steel cable, or a chain. The actuating means can also be a rod mechanism.

Preferably, the lever mechanism has at least one lever arm whose one end is fastened to the base element in pivoting fashion and whose other end is fastened to the holder in pivoting fashion; the sliding guide is provided with a cam track that engages with a pivoting pin situated on this lever arm in order, through a movement of the sliding guide, to control a pivoting motion of the lever relative to the base element; the lever arm has a locking pin, which is situated farther away from the end of the lever arm fastened to the base element than the pivoting pin and engages with another locking cam track on the sliding guide, at least in the end position.

The cam tracks are embodied as inclined relative to the interface plane; the cam tracks preferably each have a respective locking segment in which the respective pins are situated in the end position, which segment has a more gradual inclination relative to the interface plane than the remaining segment of the cam track. By means of this locking segment, the holder and interface unit are immobilized in their the end position by means of the sliding guide and only a slight force is required to hold the sliding guide itself in this position. The frictional force of the system or a spring element is sufficient to achieve this, in particular an air pressure spring that can be used to assist the movement into or out of the end position.

Preferably, an actuating lever is provided, which can be used to actuate the sliding guide. This actuating lever can be provided with a detent mechanism that at least has detent positions that correspond to the end position and an intermediate position.

The lever mechanism preferably has a linear guide, which includes two lever arms that are coupled to each other in pivoting fashion by means of a shared pivot joint; the two lever arms are each respectively connected in pivoting fashion by means of a pivot joint to the base element and/or the holder at one end and at least one of the two lever arms is arranged in pivoting fashion on the respective other part of the pair comprising the holder and base element, and the distances from the shared pivot joint to the respective pivot joints with which the lever arms are attached to the holder and the base element are the same length.

In one embodiment, the lever mechanism can have a linear guide with two lever arms that are coupled to each other and can have an additional guide with at least one lever arm, the pivoting movement of which is respectively controlled by means of a separate cam track of the sliding guide so that the holder, starting from the end position, first executes a linear translation movement perpendicular to the interface plane and then executes a pivoting movement.

Preferably, the holder has rails that can extend in telescoping fashion to permit the interface unit to be moved in linear fashion.

With the module according to the invention, when an interface unit is exchanged, the interface unit is moved out of the end position into an intermediate position—in which all contacts are released and all alignment pins and alignment holes are disengaged from one another—and then by means of the telescoping rails, is moved out of the intermediate position into a removal position in which the interface unit can be simply exchanged. In this case, it is only necessary to raise the testing unit a certain distance. There is no need to completely remove the testing unit from the handling unit. This saves a significant amount of time when exchanging the interface unit.

The module according to the invention is essentially composed of mechanical components and basically requires neither an electric nor a pneumatic control. It is therefore very low-maintenance and reliable.

The module can be integrated into a fully automated testing system and connected to a corresponding control unit. This only requires a single automatically controllable actuator, e.g. an electric motor or a pneumatic piston/cylinder unit in order to actuate the drive belt.

The interface unit can be provided with two downward-protruding positioning pins that engage in corresponding positioning bushings. The positioning bushings are mounted on the handling unit. The positioning pins and the positioning bushings constitute a pneumatically actuatable positioning system (docking system) and are embodied in accordance with U.S. Pat. No. 6,870,362 B2. The combination of a module for exchanging an interface unit with a mechanism for lifting the interface unit in a linear fashion from the end position into an intermediate position and a device for pulling out the interface unit, e.g. the telescoping rails, constitutes an independent invention idea since the module only needs to roughly position the interface unit in the end position and a fine adjustment is carried out by means of the positioning system.

The module can be provided with a distance adjusting device that has a plurality of threaded elements coupled to one another by means of the drive belt, in particular threaded flanges or threaded bushings, which engage with corresponding threaded elements on the handling unit or testing unit. By means of an actuating element, e.g. a handwheel, the drive belt can be actuated so that all of the threaded elements of the distance adjusting device rotate synchronously and the distance between the module and the handling unit or testing unit is changed. This distance adjusting device is very advantageous in combination with the module for exchanging an interface unit that has a mechanism for producing a linear lifting motion from the end position into an intermediate position and a device for pulling out the interface unit, e.g. the telescoping rails, since this makes it possible to use a wide variety of types of interface units with different thicknesses and heights and to easily exchange, position, and adjust them.

Figure 2:
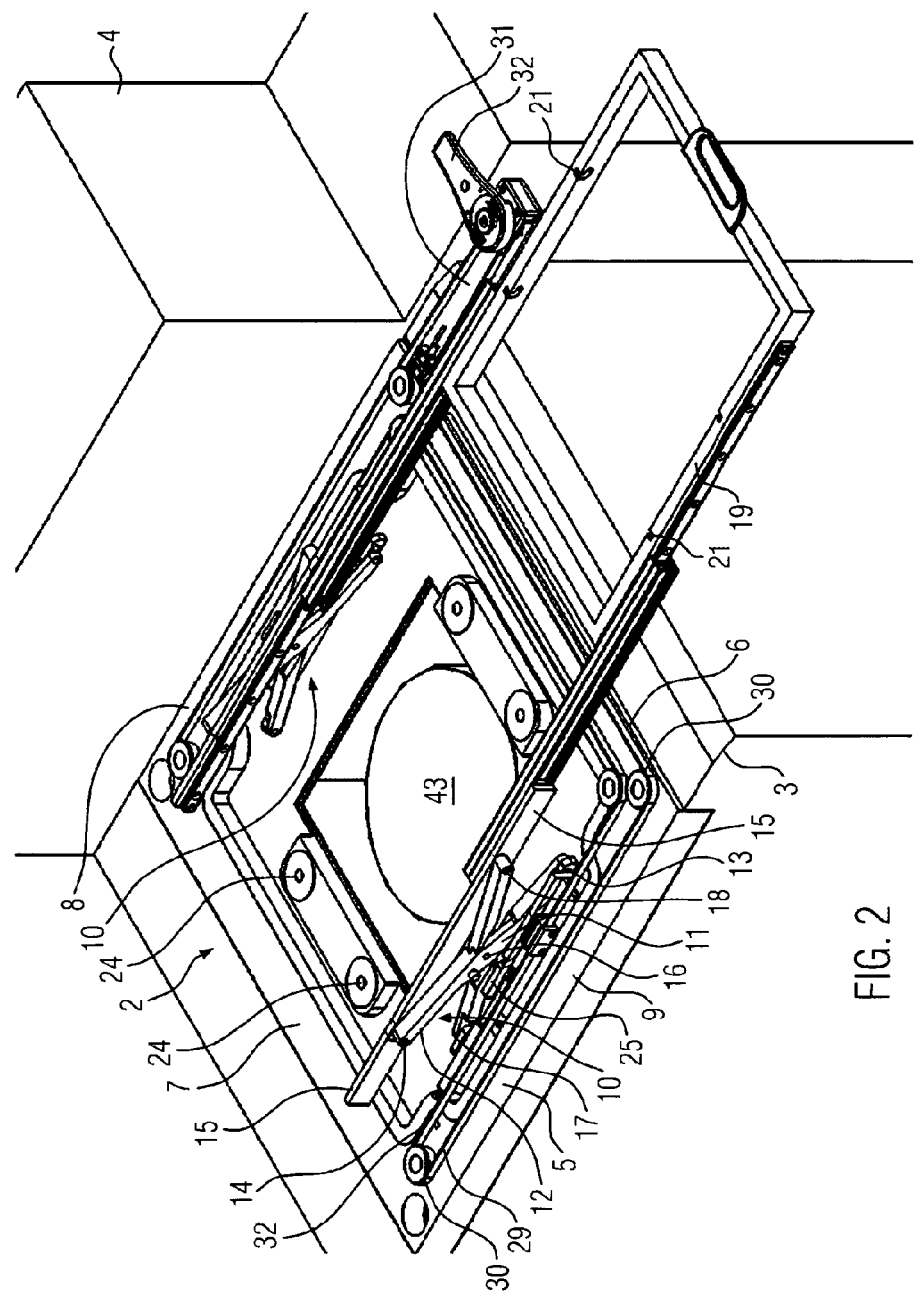
Figure 3:
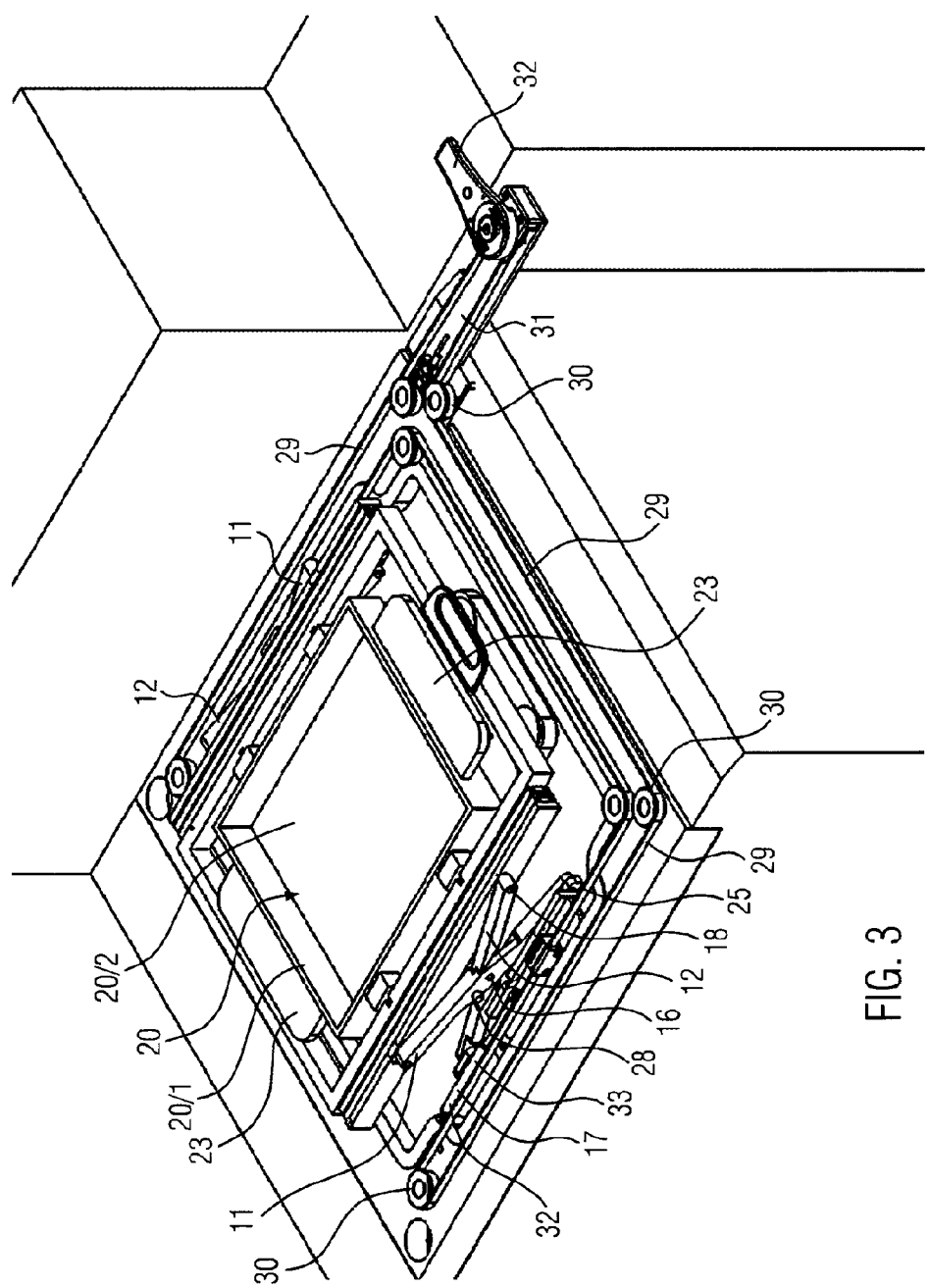
Figure 4:
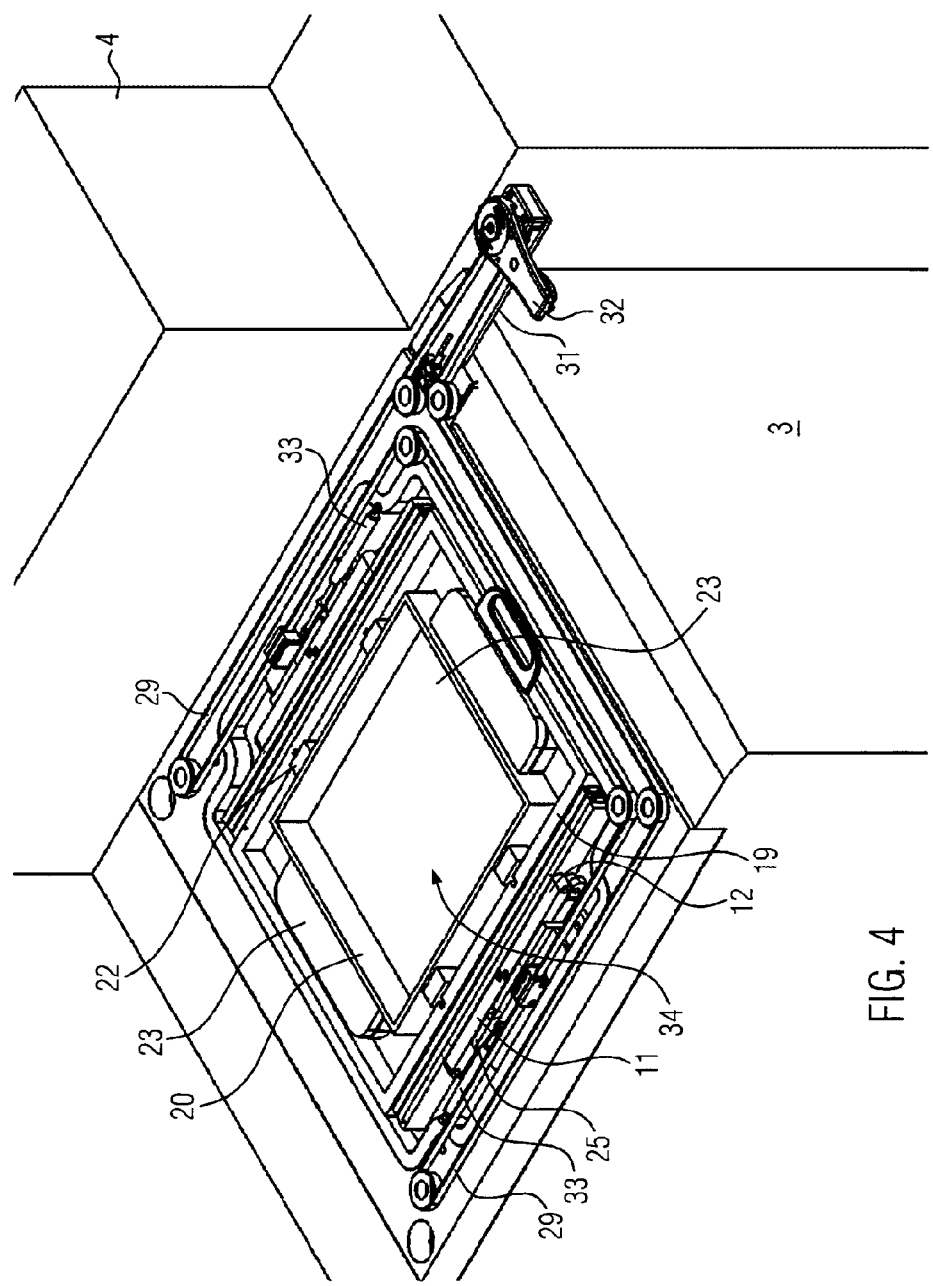
Figure 5:
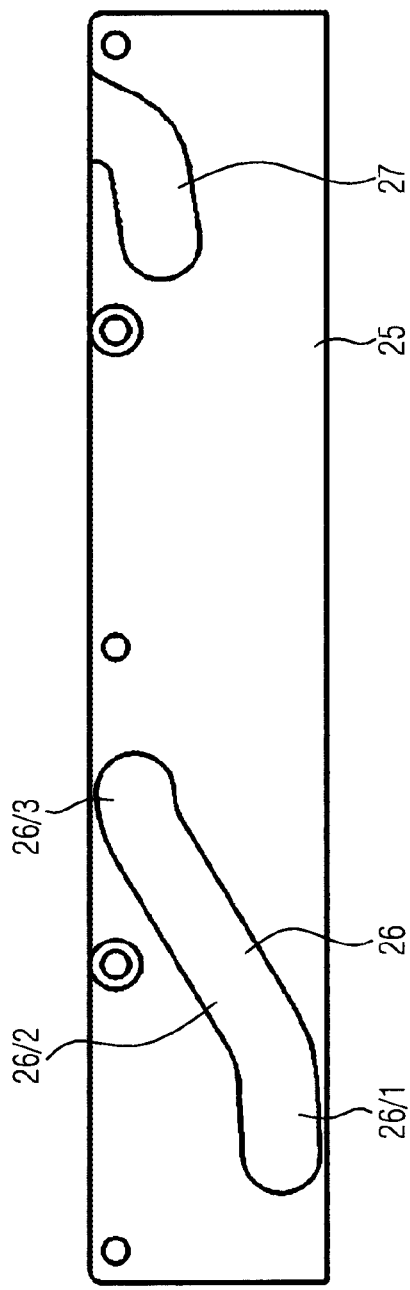
Figure 6:
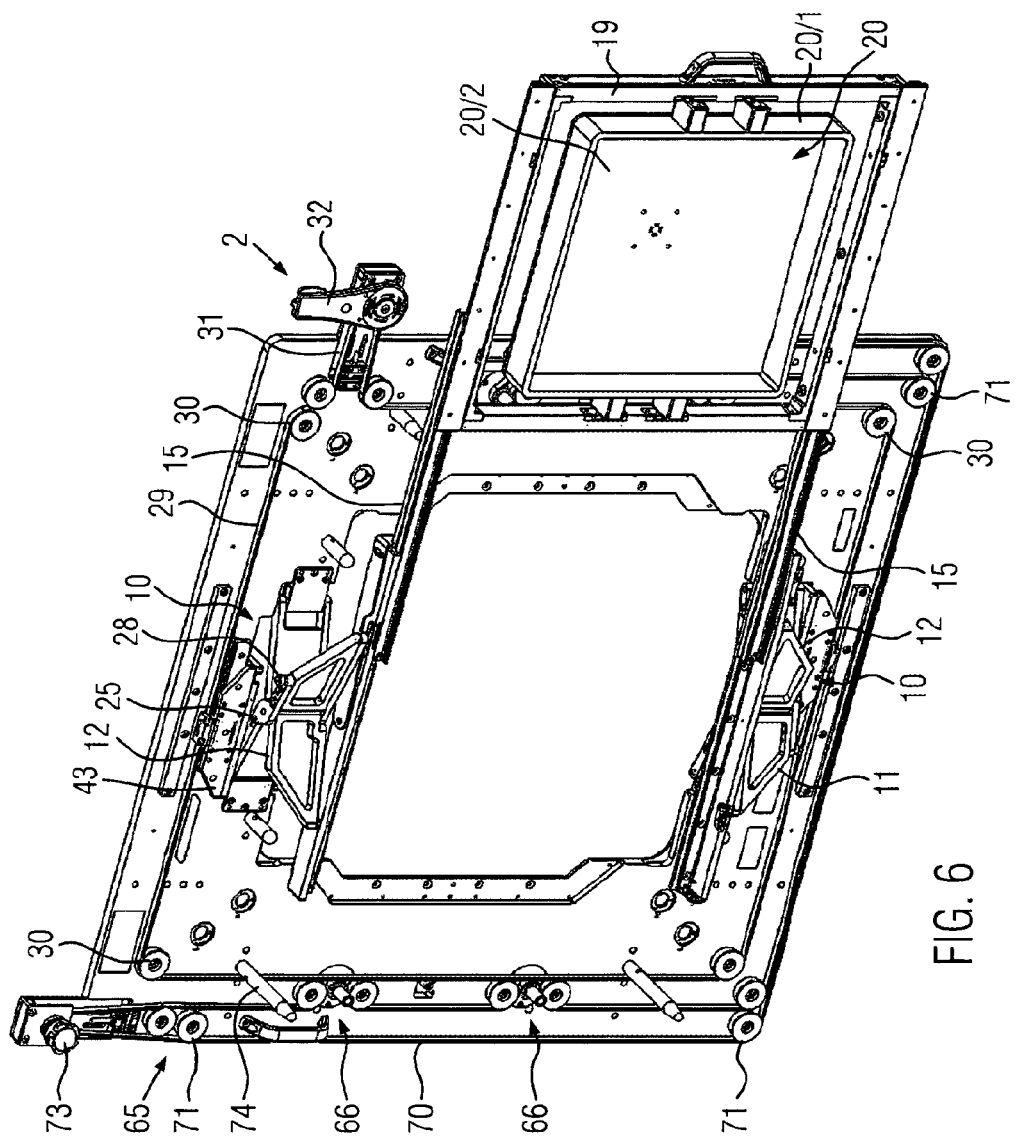
Figure 7:
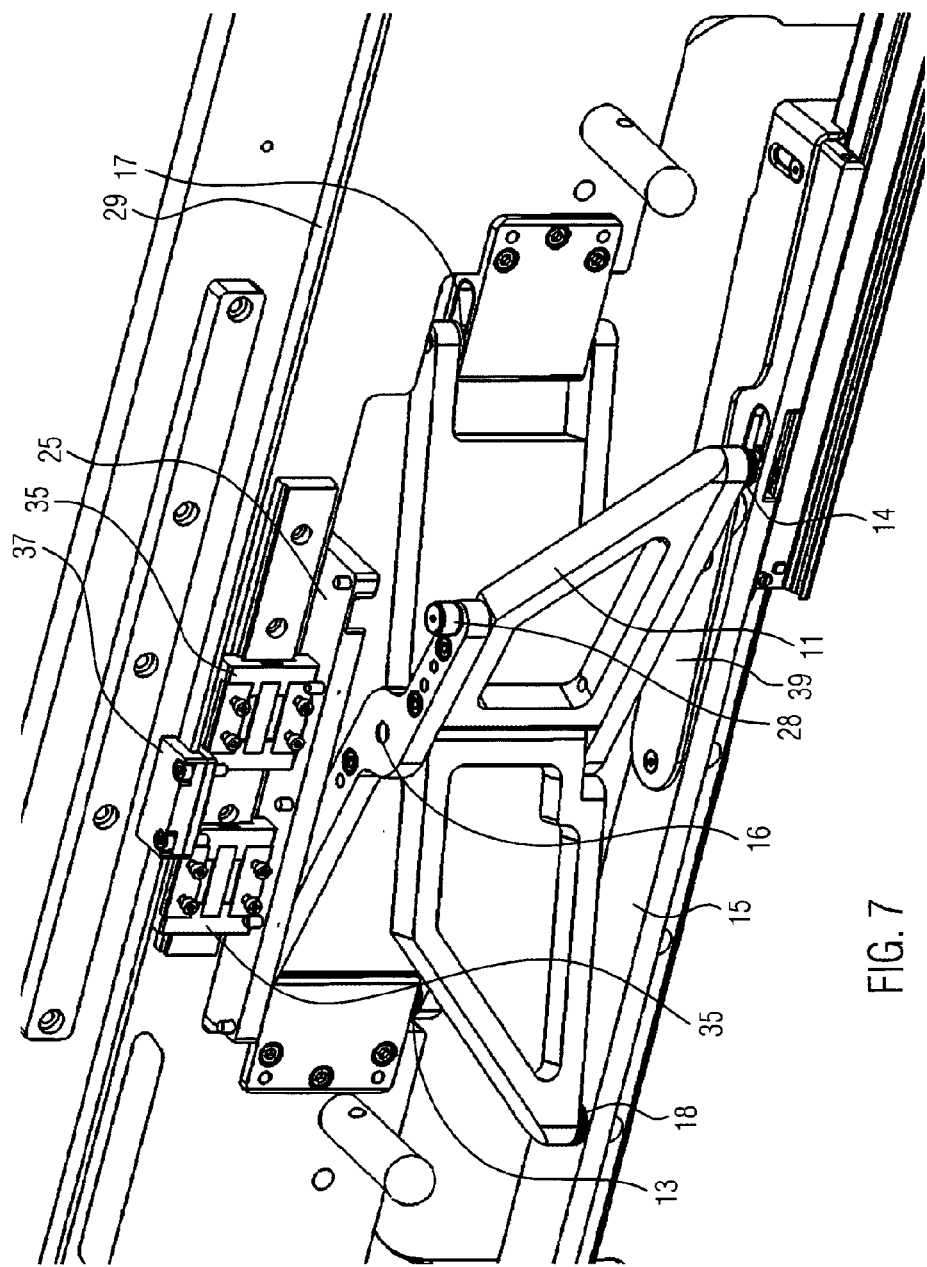
Figure 8:
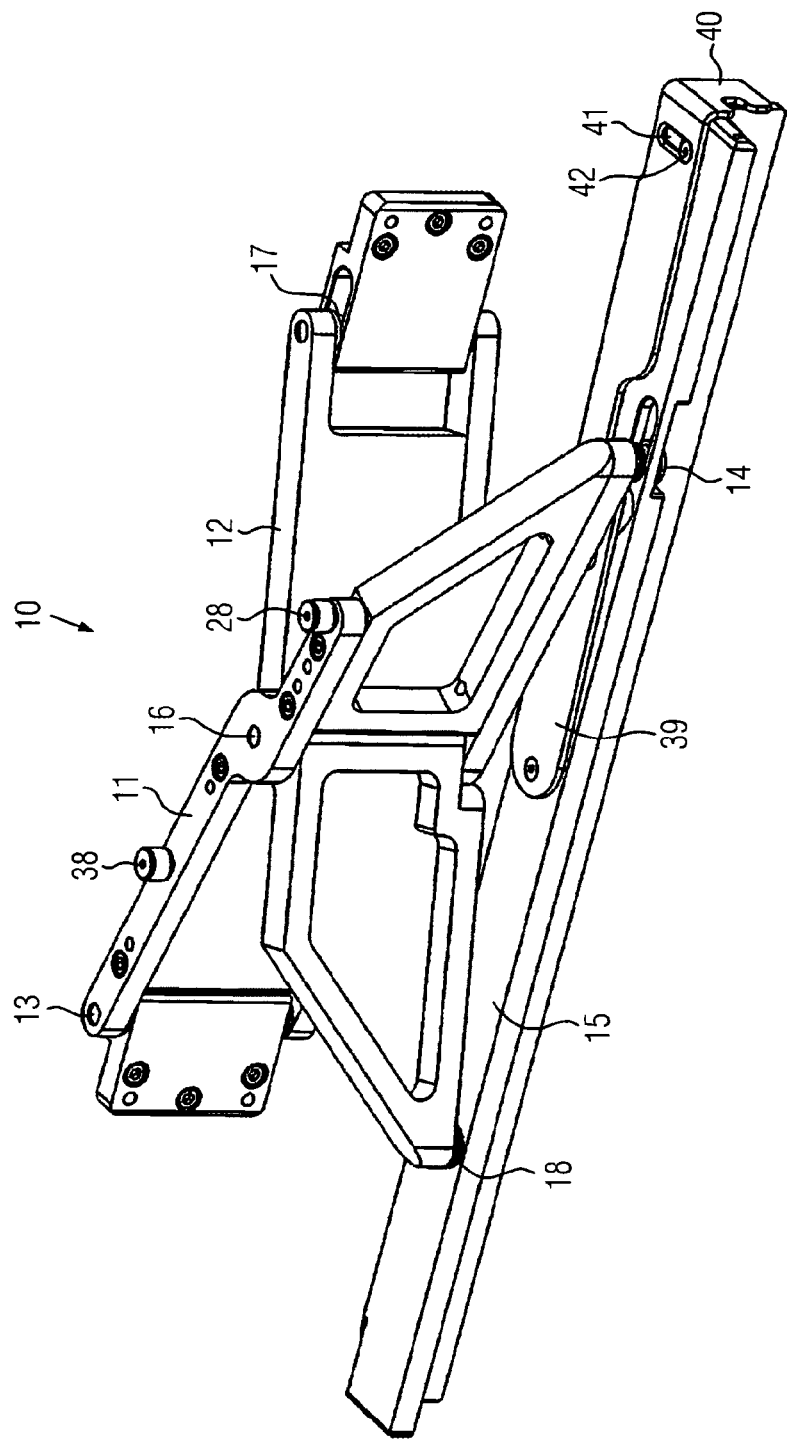
Figure 9:
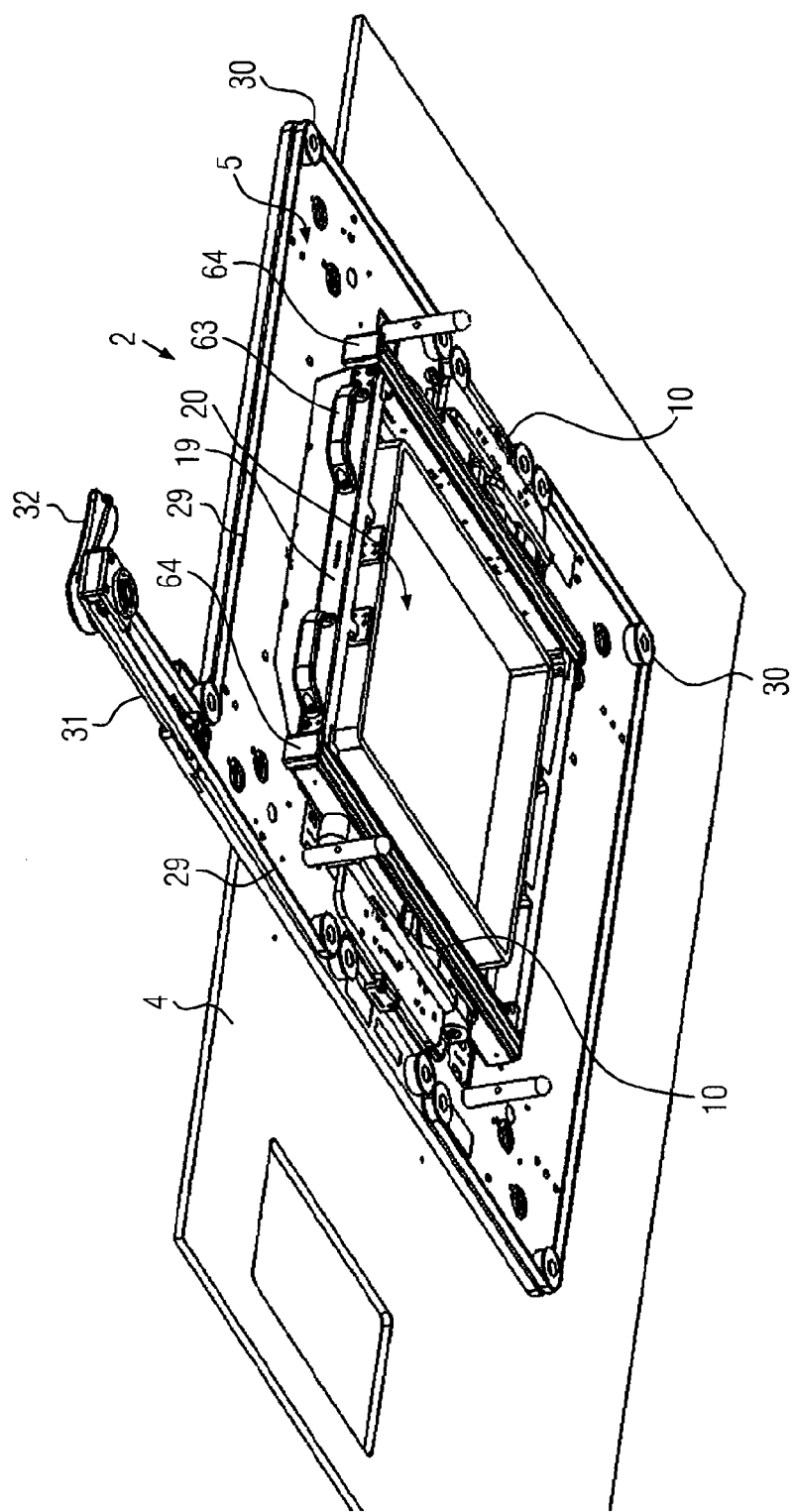
Figure 10:
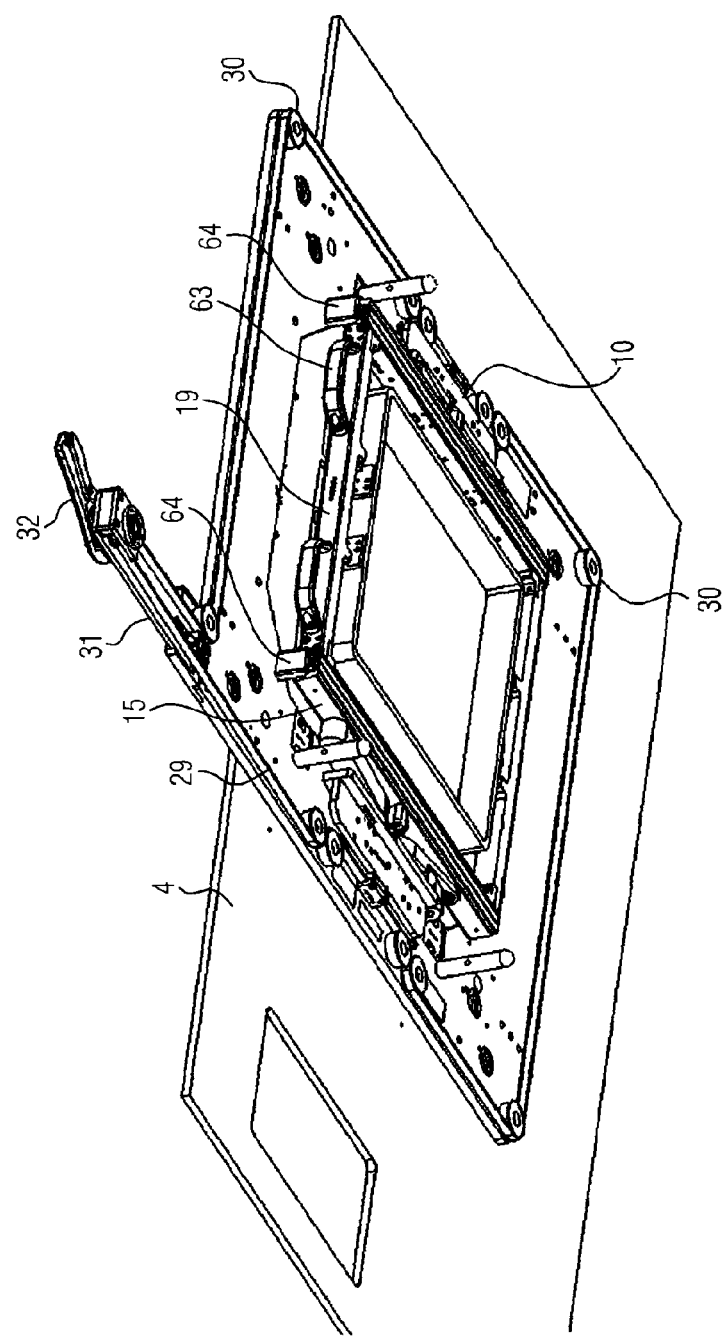
Figure 11:
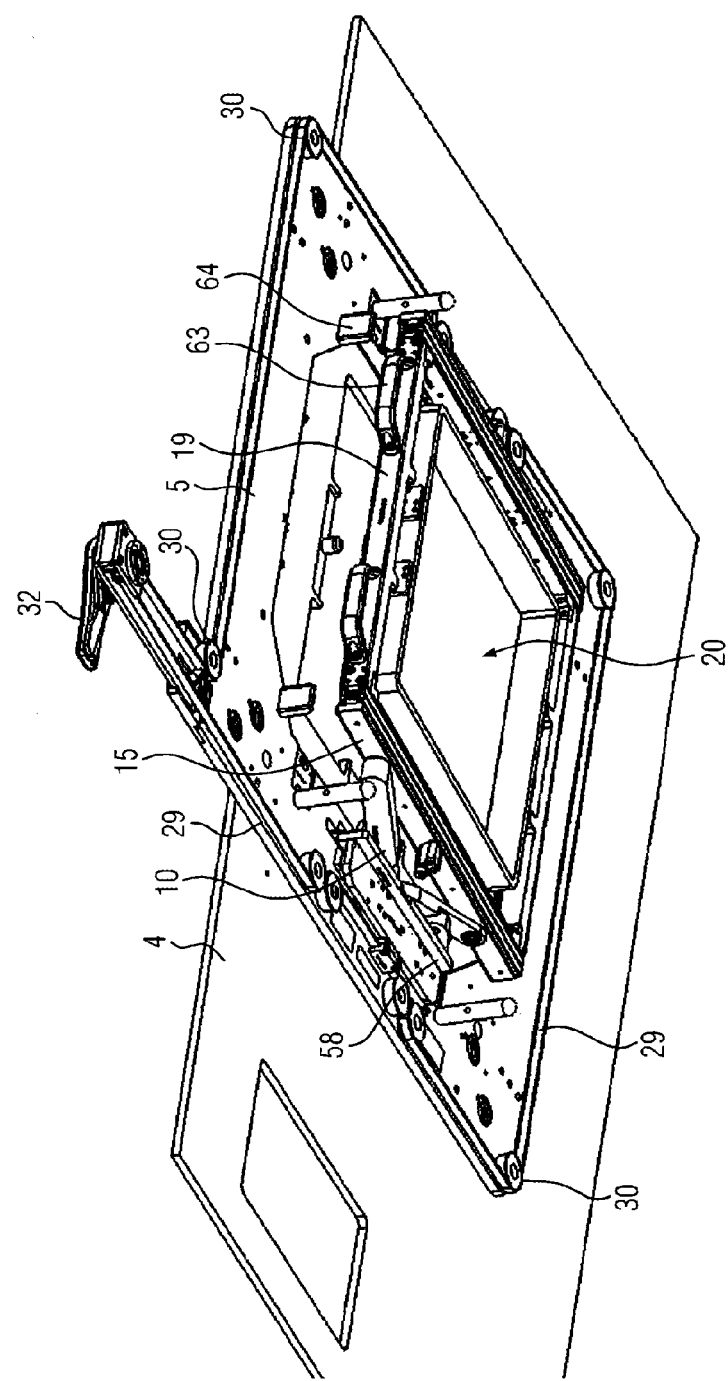
Figure 12:
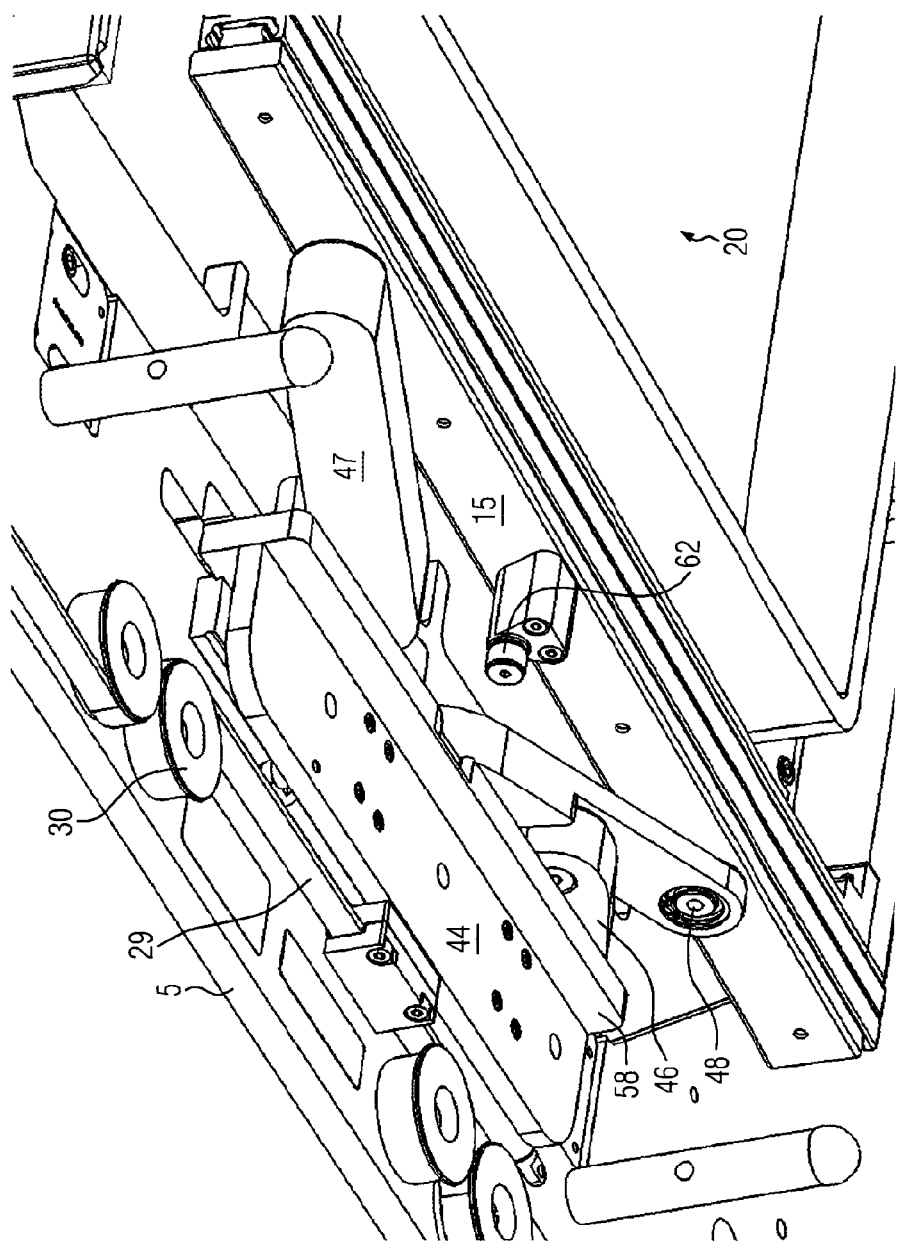
Figure 13:
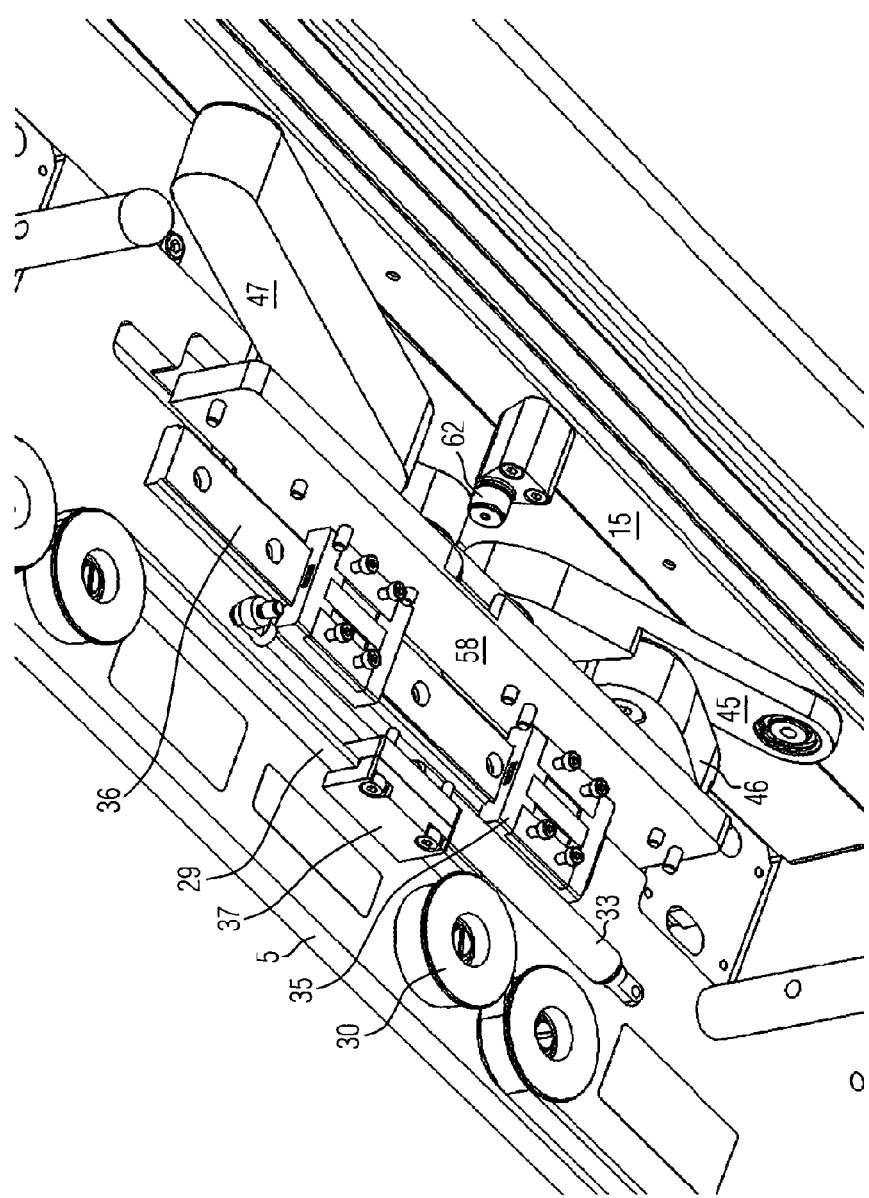
Figure 14:
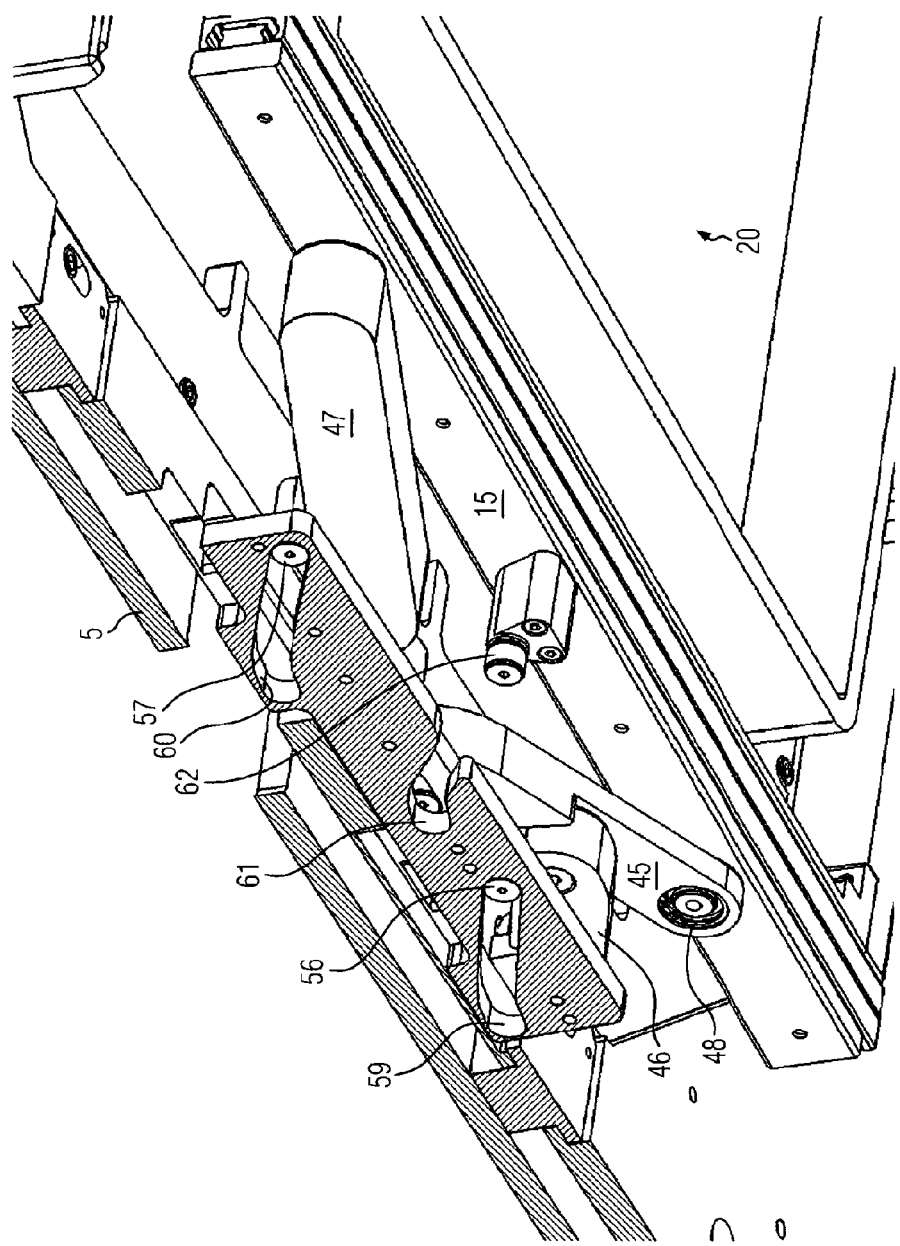
Figure 15:
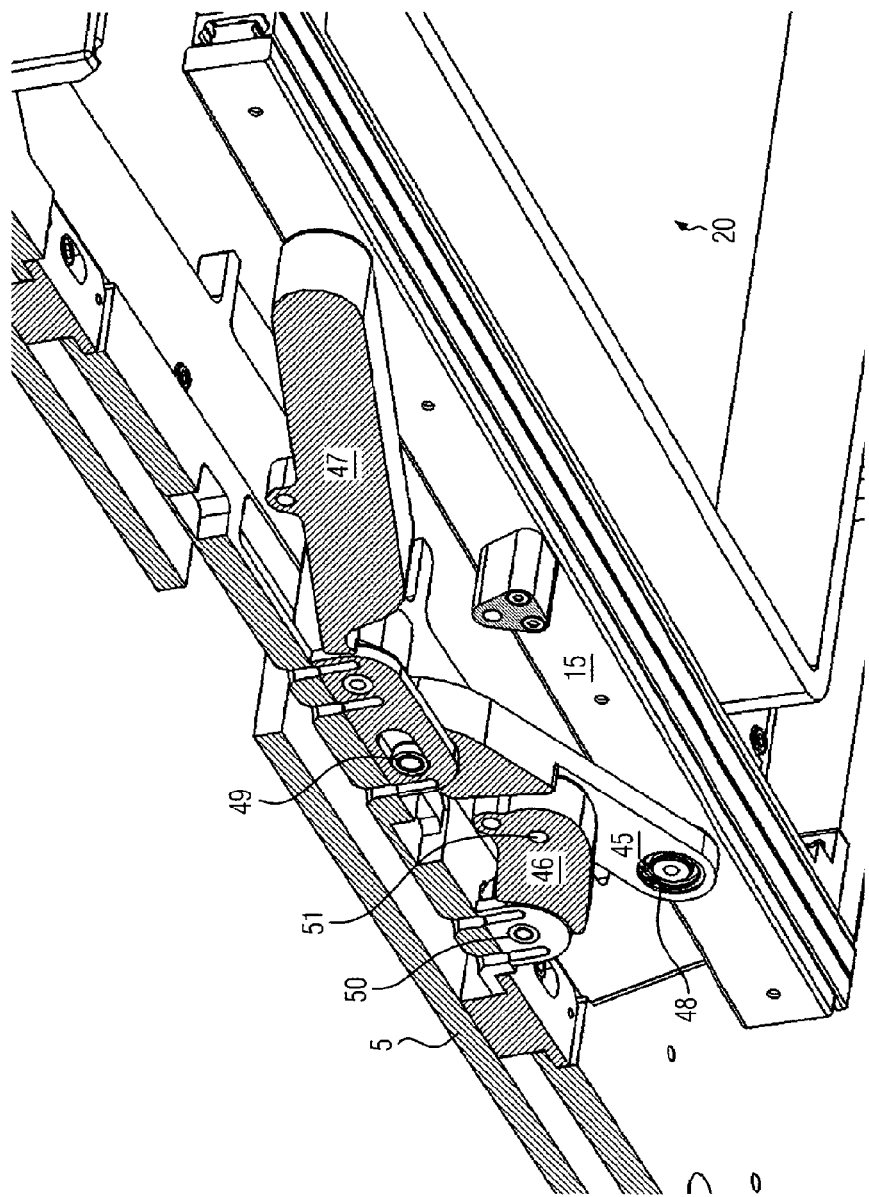
Figure 16:
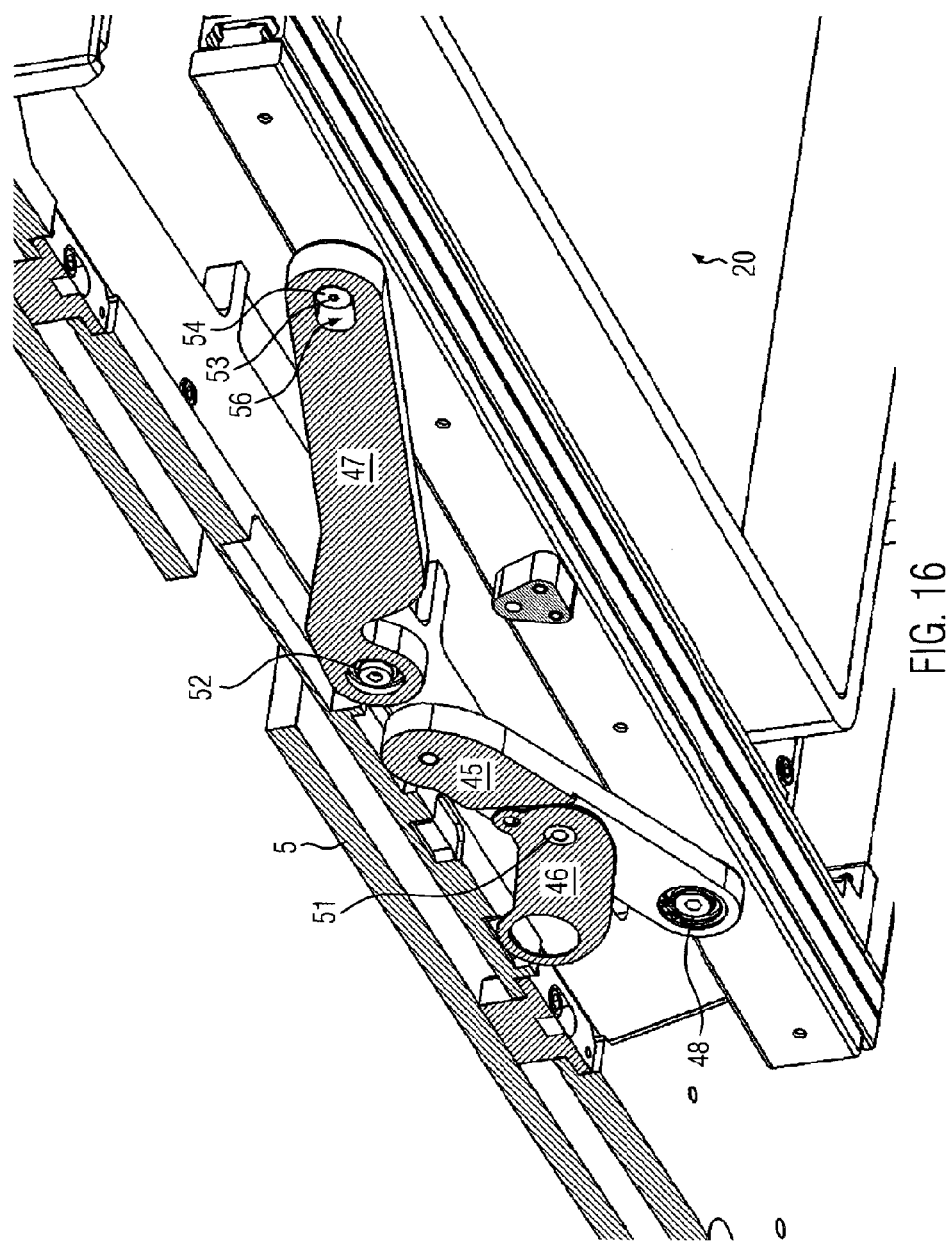
Figure 17:
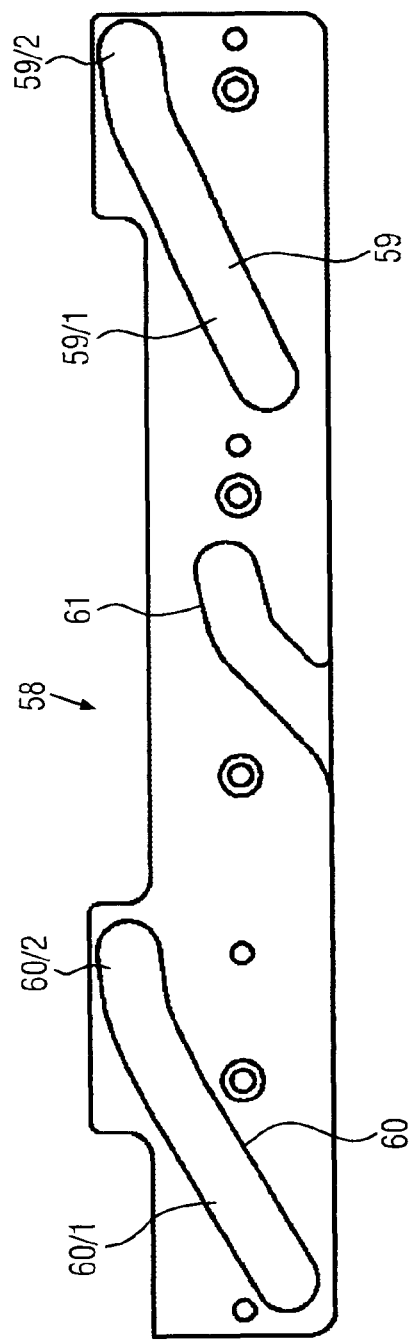
Figure 18:
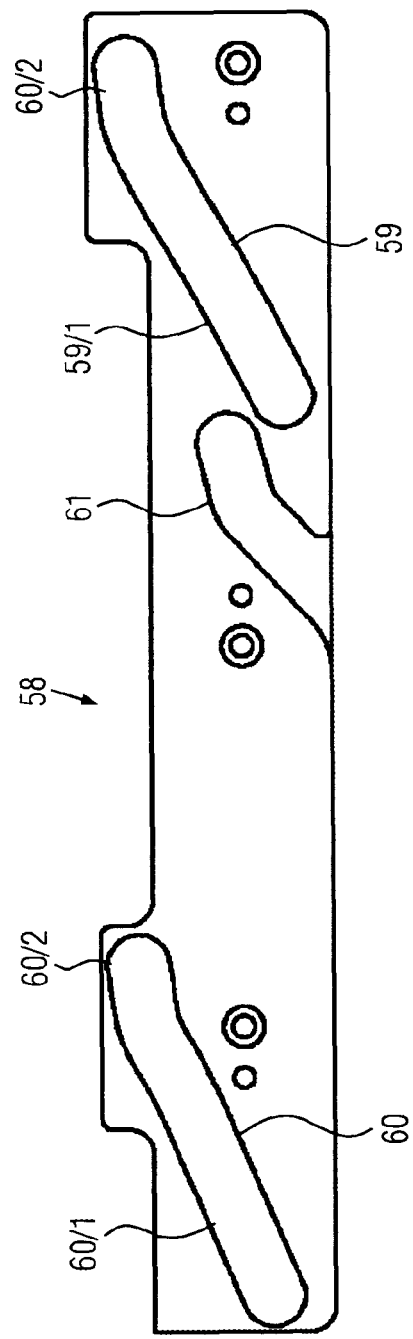
Figure 19:
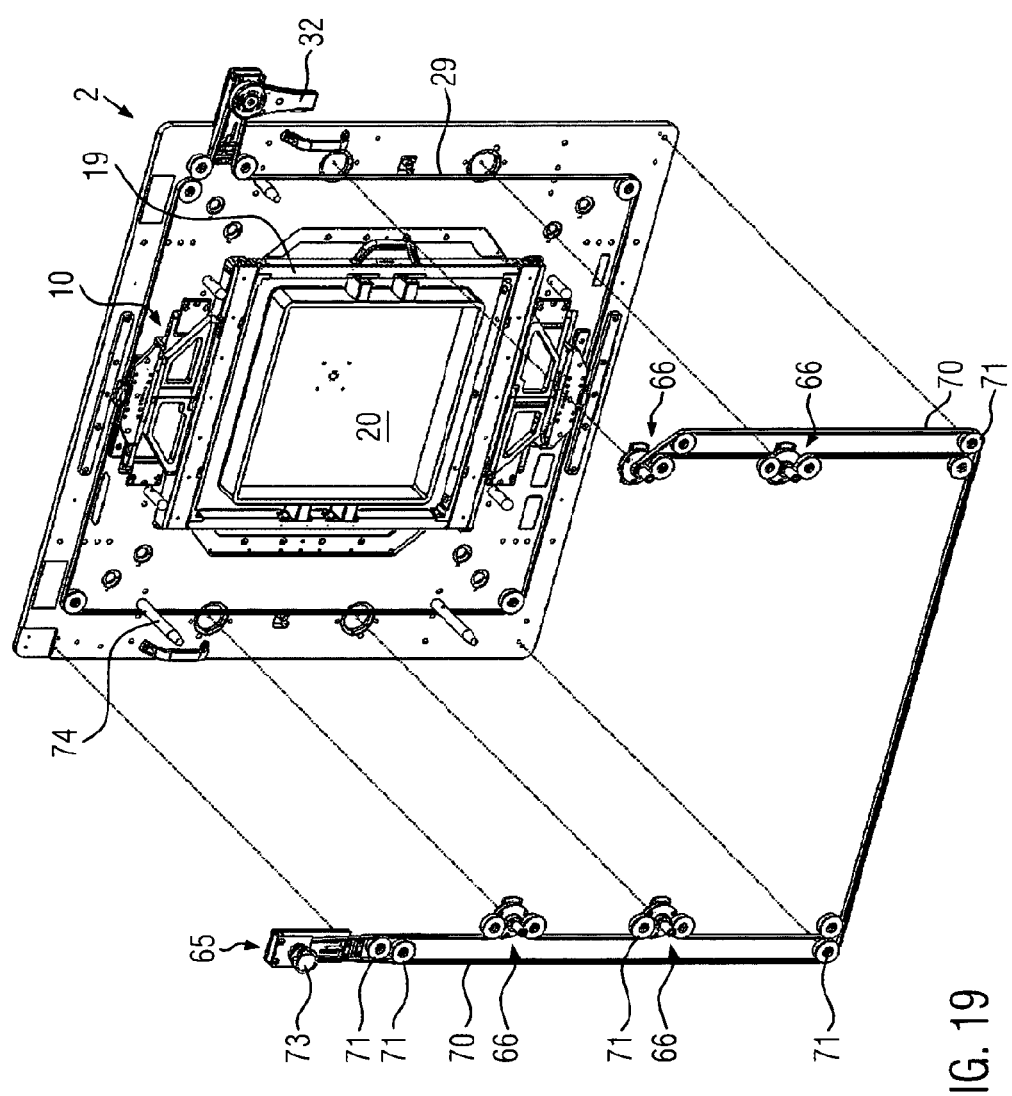
Figure 20:
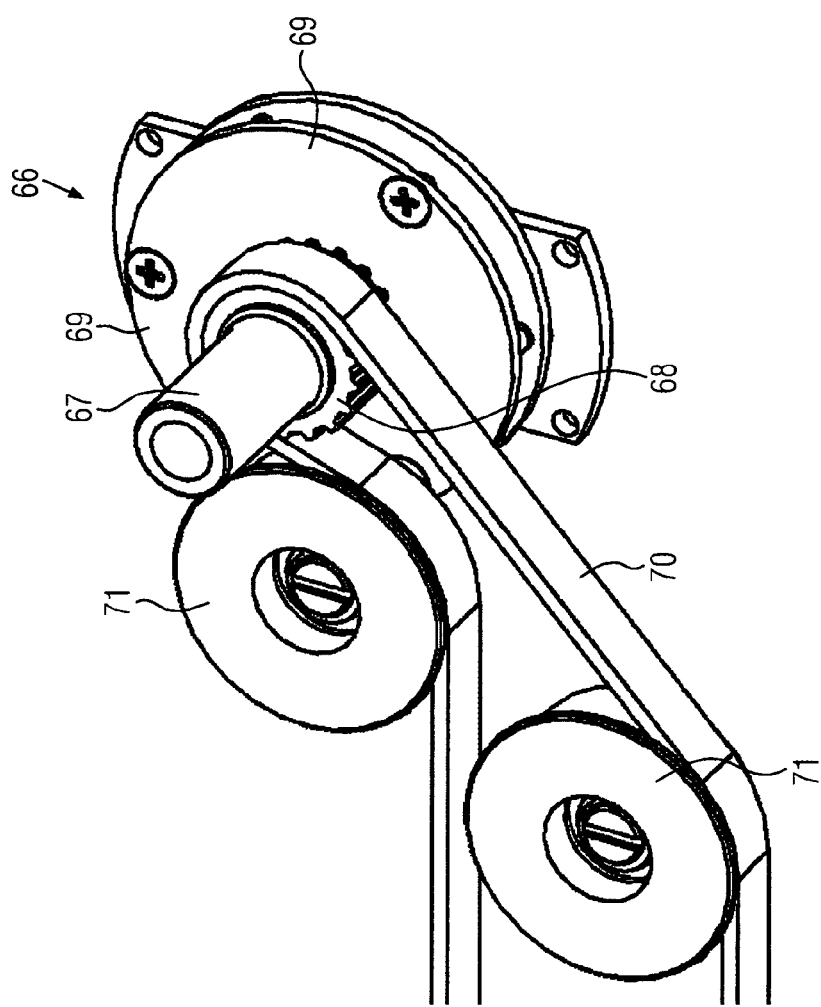
Figure 21:
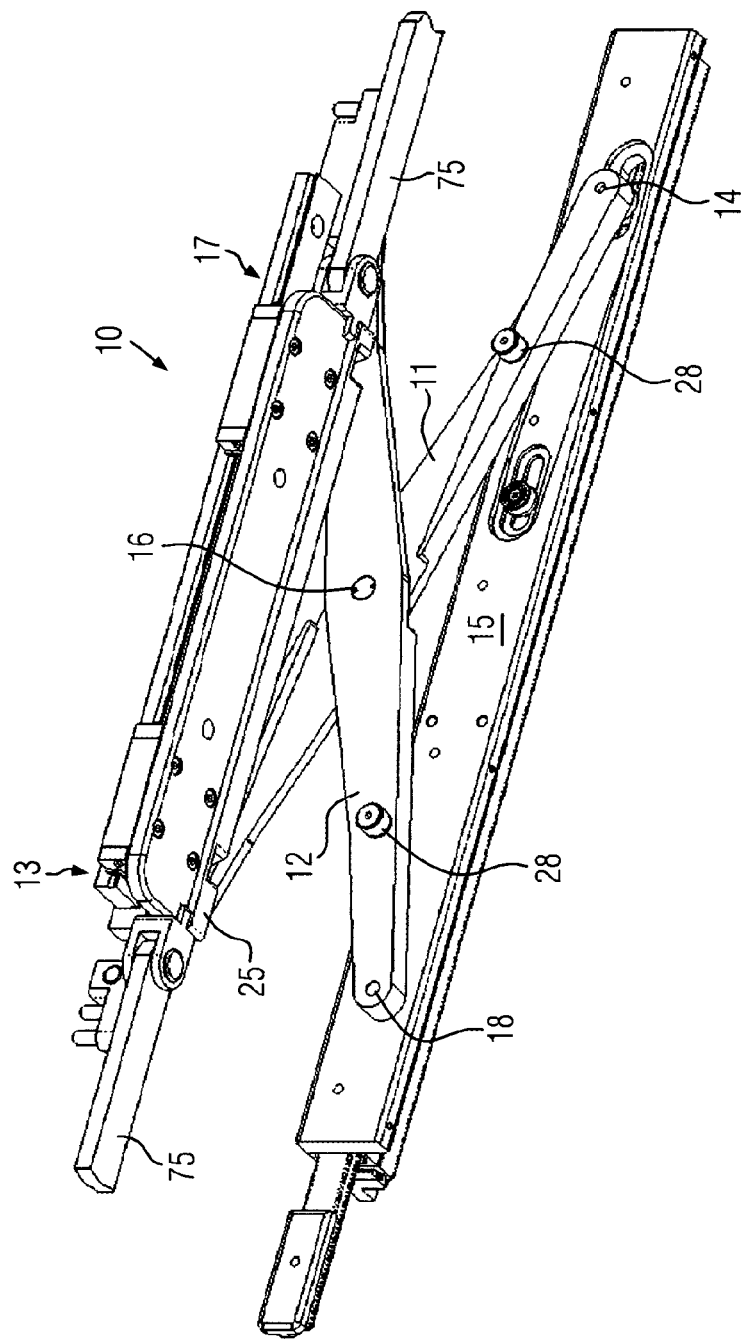
Figure 22:
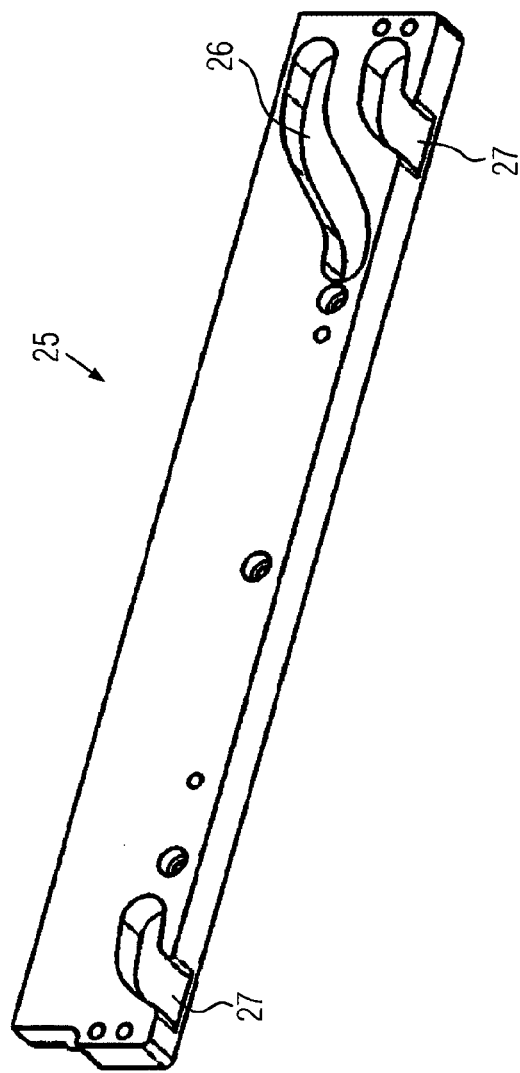

The invention will be explained in greater detail below in conjunction with examples shown in the drawings. In the drawings:

FIG. 1 is a schematic, perspective view of a testing system with a module for exchanging an interface unit, FIG. 2 shows the module from FIG. 1 in a removal position, FIG. 3 shows the module from FIG. 1 in an intermediate position, FIG. 4 shows the module from FIG. 1 in an end position, FIG. 5 is a side view of a sliding guide of the module from FIG. 1, FIG. 6 is a perspective view of a module for exchanging an interface unit for a vertical testing system, FIG. 7 is a perspective partial view of the module from FIG. 6 in the region of an upper lever mechanism, FIG. 8 is a perspective view of the lever mechanism from FIG. 7 together with a telescoping rail, without the remaining parts of the module, FIG. 9-11 are perspective views of an exchange module for a horizontal testing system, which is fastened to the underside of a testing unit, in different positions, FIG. 12 is a perspective partial view of a lever mechanism of the exchange module from FIGS. 9 through 11, FIG. 13 shows the lever mechanism from FIG. 12 with a holding plate removed from the sliding guide so that other parts are visible, FIG. 14-16 are partially cut-away views, in different planes, of the lever mechanism from FIGS. 12 and 13, FIG. 17, 18 are each side views of a sliding guide, FIG. 19 is a perspective view of the module from FIG. 6, with an interface unit in the end position and a distance adjusting device depicted in an exploded view, FIG. 20 is a perspective partial view of a distance adjusting element of the distance adjusting device according to FIG. 19, FIG. 21 is a perspective partial view of a lever mechanism of an exchange module for a horizontal testing system that can be fastened to the underside of a testing unit, and FIG. 22 is a side view of a sliding guide of the lever mechanism from FIG. 21.

FIGS. 1 through 5 schematically depict a testing system 1 for testing semiconductor elements with a first exemplary embodiment of a module 2 according to the invention for exchanging an interface unit.

The term "semiconductor elements" includes semiconductor components and wafers.

The testing system has a handling unit 3 (prober) and a testing unit 4 (tester). During operation, the handling unit 3 is situated under the testing in 4 (FIG. 1); the module 2 for exchanging an interface unit is situated between the handling unit 3 and the testing unit 4. This module 2 is referred to below as the exchange module 2.

In the first exemplary embodiment, the handling unit 3 is used to supply wafers 43 to the interface unit 20. Both the handling unit 3 and the testing unit 4 are embodied as approximately block-shaped and the side surfaces that face each other, between which the exchange module 2 is situated, are oriented horizontally. This testing system is therefore referred to as a horizontal testing system.

The exchange module 2 has a base element 5 that is fastened to the testing system 1. In the present exemplary embodiment, the base element 5 is fastened to the handling unit 3. The base element is a frame-shaped body composed of aluminum or steel, which is adapted to the contour of the handling unit 3. The base element has a front and rear lateral strut 6, 7 and a right and left longitudinal strut 8, 9. The positions "forward" and "back" as well as "left" and "right" refer to the point of view of an operator of the testing system 1 since such a testing system generally has a side from which the operator has access to the system, which in the present exemplary embodiment is at the bottom right of the drawings in FIGS. 1 through 4.

The insides of the longitudinal struts 8, 9 each have a respective lever mechanism 10 attached to them. In the present exemplary embodiment, both of the lever mechanisms 10 are identically embodied, which is why only one of the two lever mechanisms 10 is explained below.

The lever mechanism has a scissor joint composed of a first and second lever arm 11, 12.

At one end, the first lever arm 11 is connected to the inside of the longitudinal strut 8, 9 by means of a stationary pivot joint 13. At its other end, the first lever arm 11 is connected to a telescoping rail 15 by means of another pivot joint 14. The telescoping rail 15 will be explained in greater detail below. The pivot joint 14 is embodied so that it can move in the longitudinal direction of the telescoping rail 15.

The first and second lever arms 11, 12 are connected approximately in their longitudinal middle in pivoting fashion by means of a pivot joint 16.

At one end, the second lever arm 12 is connected to the inside of the longitudinal strut 8, 9 by means of a pivot joint 17 that can move in the longitudinal direction of the longitudinal strut 8, 9. At its other end, the second lever arm 12 is connected to the telescoping rail 15 by means of another stationary pivot joint 18.

The scissor joint can be folded open (FIG. 2, 3) or closed (FIG. 4) like a pair of scissors. When the scissor joint is folded open and closed, the telescoping rail is raised and lowered in relation to the base element 5. As this occurs, the telescoping rail 15 is always oriented parallel to the respective longitudinal strut 8, 9.

Since the two stationary pivot joints 13, 18 are situated opposite each other and the segments of the lever arms extending from the shared pivot joint 16 to the pivot joints 13, 14, 17, 18—with which the lever arms 11, 12 are connected to the base element 5 and the telescoping rail 15—are each the same length, the opening and closing the scissor joint produces a linear movement of the telescoping rail 15. The scissor joint thus constitutes a linear guide since it guides the telescoping rail 15 along a linear trajectory.

The two telescoping rails 15 support a holding frame 19 that forms a holder for holding an interface unit 20. The interface unit 20 is composed of a reinforcing frame 20/1 and an interface plate 20/2.

The holding frame is supported in moving fashion by means of the telescoping rails 15 so that it can be pulled out of the region above the handling unit 13.

The holding frame 19 has recesses 21 into which projections 22 protruding from the interface unit 20 can be inserted so that the interface unit 20 is held in the holding frame 19.

Two holding plates 23 protrude from the outside of the reinforcing frame 20/1 of the interface unit 20. Two downward-protruding positioning pins are situated on each of the holding plates. The positioning pins can engage in corresponding positioning bushings 24. The positioning bushings 24 are fastened to the handling unit 3. The positioning pins and positioning bushings 24 constitute a pneumatically actuatable positioning system (docking system) and are embodied in accordance with U.S. Pat. No. 6,870,362 B2.

The lever mechanisms 10 are each connected to a respective sliding guide 25. The sliding guide 25 is supported on the base element 5 so that it can move in a linear fashion. The sliding guide 25 of the present exemplary embodiment has a first cam track 26 and a second cam track 27. The first cam track 26 is referred to below as the pivoting cam track 26 and the second cam track is referred to as the locking cam track 27. The cam tracks 26, 27 are elongated recesses in the sliding guide 25 that the first lever arm 11 engages with by means of a pivoting pin (not visible in FIGS. 1 through 5) and a locking pin 28.

The two sliding guides 25, which in the present exemplary embodiment are identically embodied, are coupled to a drive belt 29, which a plurality of guide rollers 30 provided on the base element 5 guide so that one section of the drive belt extends along one of the two lever mechanisms and in these sections of the drive belt, respectively engages with one of the two sliding guides so that when the drive belt 29 moves, the drive belt causes the two sliding guides to move in a linear fashion.

The drive belt 29 in the present exemplary embodiment is a toothed belt. It can, however, also be embodied in the form of a chain, a steel cable, or a rod mechanism.

On the base element, a bar 31 is provided, which protrudes a certain distance from the front side of the base element. The remote end of the bar 31 has an actuating lever 32 that is provided with a detent mechanism. The actuating lever 32 is coupled to a pinion that engages with the drive belt in a cogged fashion so that when the pinion is rotated by means of the actuating lever, this moves the drive belt 29. The bar 31 protrudes far enough from the base element 5 that the actuating lever 32 is freely accessible even when the testing system is closed.

In lieu of the actuating lever 32, it is also possible to provide an automatic actuating device, e.g. a pneumatic lifting/piston mechanism, in order to move the drive belt 29.

A spring element 33, which is a gas pressure spring 33 in the present exemplary embodiment, is coupled between the drive belt 29 and the base element 5. In the present exemplary embodiment, one end of the gas pressure spring 33 is connected to one of the two sliding guides 25 and the other end is connected to the base element 5.

FIG. 4 shows the adapter 20 in an end position in which the positioning pins engage in corresponding positioning bushings 24 and are immobilized therein. In this end position, the interface unit is in the position required for operation of the testing system 1. In FIG. 4, the interface unit 20 is shown with a schematically simplified interface plate 20/2. The plane in which the interface plate 20/2 is situated in the end position is referred to below as the interface plane 34.

The pivoting cam track 26 (FIG. 5) has a first flat segment 26/1 (at the bottom in FIG. 5), a more steeply inclined segment 26/2, and a second flat segment 26/3 (at the top in FIG. 5). The inclination of the three segments relates to the interface plane 34, i.e. the flat segments 26/1 and 26/3 have only a slight inclination relative to the interface plane 34 and the inclined segment 26/2 has a steeper inclination relative to interface plane 34. In the following, the first flat segment 26/1 is referred to as the first locking segment 26/1, the inclined segment 26/2 is referred to as the actuating segment 26/2, and the second flat segment is referred to as the second locking segment 26/3.

During the sliding of the sliding guide 25, the pivoting pin of the lever arm 11 slides in the pivoting cam track 26 so that as the pivoting pin slides from the first locking segment 26/1 along the actuating segment 26/2 to the second locking segment 26/3, the pin is raised and as a result, the lever arm 11 is pivoted around the pivot joint 13. The pivoting movement is primarily executed due to the cooperation of the pivoting pin and the actuating segment 26/2. The locking segments 26/1 and 26/2 are embodied as flat so that they produce no pivoting movement or only a slight pivoting movement. During this pivoting movement in which the pivoting pin slides from the first locking segment 26/1 along the actuating segment 26/2 to the second locking segment 26/3, the scissor joint is opened and the holding frame 19 with the adapter 20 is raised from the end position up into an intermediate position (FIG. 3). Because the second locking segment 26/3 is embodied as very flat, the sliding guide 25 locks the scissor joint in this intermediate position.

In this intermediate position, the holding frame 19 and the adapter 20 can be pulled out of the region of the handling unit 3 by means of telescoping rails. The holding frame 19 and the adapter 20 are then situated in a removal position (FIG. 2) in which the adapter 20 can be easily exchanged by a user. Devices are provided, which prevent the telescoping rails from being pulled out if they are not in the intermediate position. These devices are not shown in the schematically simplified FIGS. 1 through 5.

If the sliding guide 25 is moved back so that the pivoting pin slides from the second locking segment 26/3 along the actuating segment 26/2 to the first locking segment 26/1, then the lever arm 11 is pivoted downward so that the scissor joint is closed. This closed position (FIG. 4) is the end position. During the lowering of the lever arm, the locking pin 28 engages in the locking cam track 27, which has an opening at the top and extends with a flat orientation relative to the interface plane 34 (= has a slight inclination relative to the interface plane 34). The locking pin 28 and the locking cam track 27 are situated farther away from the pivot joint 13 than the pivoting pin and the corresponding pivoting cam track 26 so that because of the longer lever, a more powerful additional locking of the scissor joint is produced in the end position.

The locking pin 28 and the locking cam track 27 produce an additional immobilization of the telescoping rail 15 and prevent the latter from bending. It is therefore possible to comply with the required tolerances, even without a positioning system including the positioning pins and positioning bushings 24. This particularly applies to testing systems for testing semiconductor components since the tolerances in them are greater than in testing systems for testing wafers.

During the lowering, the gas pressure spring 33 is compressed so that the gas pressure spring 33 counteracts the weight of the holding frame 19, the adapter 20, and the interface unit. As a result, the actuating lever 32 can be actuated with less force in order to move the module from the end position (FIG. 4) into the intermediate position (FIG. 3) and back again. The detent mechanism of the actuating lever at least has detent positions for the end position and the intermediate position so that in connection with the locking action of the pivoting cam track 26 and the locking cam track 27, the exchange module 2 is securely held in the end position and in the intermediate position.

In the intermediate position, the holding frame can be pulled out by means of the telescoping rails 15 in order to exchange the adapter 20 with the interface unit.

The linear guidance of the scissor joint with the lever arms 11, 12 ensures that the positioning pins are correctly guided into and out of the positioning bushings 24 and if additional contact pins are provided on the interface unit, ensures that these contact pins are not damaged.

The first exemplary embodiment described above is a testing system for testing wafers that are supplied to the interface unit equipped with a handling unit (prober). In the context of the invention, the testing system can also be embodied for testing semiconductor components. Among professionals, a handling unit for supplying wafer discs is referred to as a "prober" and a handling unit for supplying individual integrated circuits is referred to as a "handler."

FIGS. 6 through 8 show a second exemplary embodiment of an exchange module 2 for a testing system that is designed for testing semiconductor components. This testing system is a vertical testing system, in other words, the handling unit and the testing unit (not shown) are situated next to each other and the connecting sides that contact each other are oriented vertically. Correspondingly, an approximately planar, which is situated between the handling unit 3 and the testing unit 4, must be oriented vertically.

This exchange module 2 for a vertical testing system is essentially embodied in exactly the same way as the exchange module for a horizontal testing system, as depicted in FIGS. 1 through 5. For this reason, parts that are the same have been provided with the same reference numerals and will not be explained again. This exchange module 2 also has two lever mechanisms 10, a lower lever mechanism and an upper lever mechanism, which each have a respective scissor joint composed of a first lever arm 11 and second lever arm 12. The two lever mechanisms 10 are identically embodied. The lower lever mechanism 10 must support the weight of the interface unit 20 and the holding frame 19 as well as the telescoping rail 15. For this reason, the first lever arm 11 and second lever arm 12 are embodied as wider and thicker than in the first exemplary embodiment in order to absorb the force of gravity without distorting and transfer it to the base element 5.

The sliding guides 25 are each fastened to two respective carriages 35 by means of a respective connecting plate 43. In FIG. 7, the connecting plate has been omitted to provide a better view of the carriages and the sliding guide. The carriages 35 are supported in mobile fashion on a rail 36. The carriages 35 are connected by means of a fastening block 37, which is fastened to the drive belt 29.

The sliding guide 25 has the same cam tracks 26, 27 as in the first exemplary embodiment. The locking pin 28 and pivoting pin 38 (FIG. 8) engage in the cam tracks. The locking pin 28 and pivoting pin 38 are embodied in the form of rollers that protrude from the lever arm 11 and fit into the recess of the cam tracks 26, 27.

The telescoping rail 15 has a locking plate 39 mounted on it in pivoting fashion; the locking plate 39 is connected in pivoting fashion approximately in the longitudinal middle of the segment of the telescoping rail 15 that is connected to the first and second lever arm 11, 12. From this linkage point, the first locking plate 39 extends to the end of this segment that the other segments of the telescoping rail 15 can be pulled out from. This end of the segment is enclosed by a locking segment 40 of the locking plates. Adjacent to the locking segment 40, the locking plate 39 is provided with an oblong hole 41 through which a pin 42 fastened to the telescoping rod 15 extends, thus defining a pivoting movement of the locking plate 39. In the locking plates 39, a cam track adjacent to the lever arm 11 is provided, which is engaged by a pin protruding from the lever arm 11 so that when the scissor joint is folded closed, the locking plate 39 is pivoted so that its locking segment 40 locks the telescoping rail so that it cannot be extended. If the telescoping rail is in the extended position (FIG. 7), then the locking segment 40 of the locking plate 39 strikes against the extended segment of the telescoping rail 15, thus preventing a pivoting movement back into the locked state of the locking plate 39. This locking action is transmitted via the cam track/pin mechanism between the locking plate 39 and the first lever arm 11 so that when the telescoping rail 15 is extended, the lever mechanism 10 is locked and cannot be folded closed.

The locking plate 39 therefore ensures that the telescoping rail 15 can only be extended in the intermediate position and must be retracted when the lever mechanism 10 is folded closed.

FIGS. 9 through 18 show a third exemplary embodiment of an exchange module. This exchange module 2 is embodied similarly to the two preceding exemplary embodiments and therefore, parts that are the same have been provided with the same reference numerals. They will not be explained again.

The exchange module 2 according to the third exemplary embodiment is once again provided for a horizontal testing system for testing semiconductor components; in this case, the exchange module is attached to the underside of the testing unit 4, which is only depicted in schematic fashion in the form of a plate in FIGS. 9 through 11.

In this exemplary embodiment, the lever mechanism 10 differs from the preceding exemplary embodiments with regard to the guidance of the holding frame 19 and interface unit 20 in that instead of a scissor joint, a linear guidance is provided, with a long lever arm 45, a short lever arm 46, and an additional guide with a separate lever arm 47 (FIGS. 15, 16).

The short lever arm 46 of the linear guide corresponds to the first lever arm 11 of the first and second exemplary embodiments. The long lever arm 45 is connected to the telescoping rod 15 by means of a stationary pivot joint 48 and is connected to the base element 5 by means of a movable pivot joint 49. The short lever arm 46 is connected to the base element 5 by means of a stationary pivot joint 50 and is connected approximately to the middle of the long lever arm 45 by means of another pivot joint 51. The distance between the pivot joints 48 and 49 on the one hand and the pivot joint 51 on the other (=effective lever lengths of the long lever arm) is equal to the distance between the pivot joint 50 and the pivot joint 51 (=effective lever length of the short lever arm 46 relative to the connecting point to the long lever arm 45). The two opposing joints 48, 50 are stationary so that the linear guidance during the pivoting of the long lever arm 45 around the movable pivot joint 49 guides the pivot joint 50, which is affixed to the base element 5, along a straight line that extends perpendicular to the interface plane.

The separate lever arm 47 is connected to the base element 5 by means of a stationary pivot joint 52 and is connected to the telescoping rail 15 with a movable pivot joint 53. The movable pivot joint 53 is composed of a rotatable pin 54, which is supported on the telescoping rail 15, and an oblong hole 56 provided in the separate lever arm 47 and extending in the longitudinal direction of the lever arm 47.

The movable pivot joint 49 is composed of an oblong hole 56 and a rotatable pin 54, with the oblong hole 54 extending parallel to the interface plane.

The short lever arm 46 is provided with an outward-protruding pivoting pin 56 and the separate lever arm 47 is also provided with another outward-protruding pivoting pin 57.

A sliding guide 58 that is movable in linear fashion has a first pivoting cam track 59 and a second pivoting cam track 60. The first pivoting cam track 59 is engaged by the first pivoting pin 56 of the linear guide. The second pivoting cam track 60 is engaged by the second pivoting pin 57 of the separate lever arm 47 (FIG. 14). The two pivoting cam tracks 59, 60 are each situated in a respective end region of the strip-shaped sliding guide 58.

The sliding guide 58 has a locking cam track 61 in its longitudinal middle, which is open at the bottom. A locking pin 62 is fastened to the telescoping rail 15 by means of a corresponding holder so that the locking pin 62 can engage in the locking cam track 61.

The pivoting cam tracks 59, 60 each have a lower actuating segment 59/1 and 60/1, respectively, that is inclined and an upper locking segment 59/2 and 60/2, respectively, that is only inclined slightly relative to the interface plane or is parallel to it.

If the sliding guide is moved so that the pivoting pins 56, 57 slide upward from the lower end of the actuating segments 59/1 and 60/1 in the direction toward the locking segment 59/2 and 60/2, then the short lever arm 46 is pivoted upward around the pivot joint 50 and the separate lever arm 47 is pivoted upward around the pivot joint 52. This raises the telescoping rail 15 together with the holding frame 19 and the interface unit 20.

Once the telescoping rail 15 reaches a certain height, the locking pin 62 engages in the locking cam track 61. Like the two other cam tracks 59, 60, the locking cam track 61 has a flat locking segment so that all three pins 56, 57, 62 are in the locking segment at the same time when the sliding guide 58 is slid into its end position.

When the sliding guide 58 is moved back, the three pins slide along the pivoting cam tracks 59, 60 and locking cam track 61. The shape of the actuating segments 59/1 and 60/1 defines the pivoting movement of the lever arms 46 and 47; the distance traveled by the sliding guide 58 defines how far the two levers 45, 47 are pivoted. In the present exemplary embodiment, the shape of these actuating segments 59/1 and 60/1 has been selected so that when the sliding guide 58 is moved, the ends of the lever arms 45 and 47 connected to the telescoping rail 15 are first lowered by the same length and after a certain distance has been traveled, the separate lever arm 47 is lowered farther than the long lever arm 45 of the linear guide. As a result, the telescoping rail 15 is tilted slightly relative to the interface plane 34. This different actuation by means of the different pivoting cam tracks 59, 60 is hardly perceptible when the cam tracks 59, 60 are inspected with the naked eye. These pivoting components can, for example, be produced by means of a steeper inclination in the lower region of the actuating segment 60/1. In this case, the length of the lever arms and the engagement points of the pivoting pins must be taken into account so that a more steeply inclined the cam track does not necessarily result in a faster lowering. Basically, however, the more steeply the cam track is inclined, the more quickly the corresponding lever or lever mechanism is lowered.

The opposing sliding guides 58 are moved in opposite directions when actuated by the drive belt 29. The cam tracks are each situated on the inside of the respective sliding guide 58. As a result, when viewed in the direction toward the cam tracks, the sliding guides each travel in the same direction, e.g. from left to right in FIGS. 17 and 18. The cam tracks of the two sliding guides 58 are therefore oriented in the same direction. These two sets of cam tracks, however, differ slightly because of the pivoting components.

In this exemplary embodiment, the separate lever arm 47 is controlled with a separate pivoting cam track, independently of the respective linear guide. This independence is utilized to move the telescoping rails 15 initially in a direction parallel to the interface plane and after a certain distance is traveled, to lower them by means of a pivoting motion.

FIG. 9 shows the exchange module 2 with the holding frame 19 raised all the way and the interface unit 20 raised all the way. In FIG. 10, the holding frame has been lowered a certain distance and is still parallel to the interface plane 34. In FIG. 11, the holding frame is in the intermediate position in which the telescoping rail 15 are lowered all the way relative to the base element 5. The front side of the holding frame here is lowered more quickly than the back side due to the quicker lowering relative to the linear guide 45, 46 by means of the separate lever arm 47. Because of this inclination, the holding frame with the interface unit 20 can be pulled out in a downwardly inclined direction. Corresponding handles 63 are provided on the holding frame 19 to facilitate pulling it out.

The base element 5 is provided with two small plates 64 situated adjacent to the front end of the retracted the telescoping rails 15. The small plates 64 extend down from the base element until they cover part of the telescoping rails as long as the telescoping rails 15 are situated parallel to the base element and parallel to the interface plane. If the telescoping rails are pivoted into the intermediate position (FIG. 11), then they are no longer covered by the small plates 64. The telescoping rails can be extended together with the holding frame 19 and the interface unit 20. These small plates consequently prevent the holding frame from being pulled out before the holding frame or interface unit is sufficiently far away from the interface plane.

The second exemplary embodiment of an exchange module 2 shown in FIG. 6 has a distance adjusting device 65, which is depicted in an exploded view in FIG. 19 so that it is lifted away from the base element 5. This distance adjusting device 65 has four distance adjusting elements 66 (FIG. 20). Each distance adjusting element 66 has a threaded flange 67. The threaded flange 67 is embodied as tubular and has an external thread on its outer surface. One end of the threaded flange 67 is screwed into a gear 68. The gear 68 is situated on a bearing washer 69. The gear 68 is supported in rotary fashion by means of an axial and radial bearing (not shown).

The four distance adjusting elements 66 are distributed around the rim of the base element and their threaded flanges 67 protrude from the base element 5 in the direction toward the handling unit.

A second drive belt 70 is guided by means of guide rollers 71 along the edge region of the base element 5 so that the drive belt 70 engages with all of the gears 68. The base element has another bar 72 fastened to it, which protrudes from the edge of the base element 5. The bar 72 supports a manually actuatable handwheel 73, which is coupled to another gear (not shown). This gear also engages with the drive belt 70 so that the drive belt can be moved by rotating the handwheel 73. The rotation of the handwheel 73 is thus transmitted to all of the threaded flanges 67 of the distance adjusting elements 66. The handwheel 73 is provided with a digital scale (not shown), which counts the rotations of the handwheel.

The individual hollow threaded flanges 67 are fastened to corresponding threaded holes in the testing unit by means of screws (not shown); the screws extend through the hollow threaded flanges 67.

For joining the testing unit 4 to the handling unit 3, pre-centering pins 74 are provided, which protrude from the base element and engage in corresponding holes in the handling unit 3. When the two components are joined, the pre-centering pins 74 are guided into the corresponding holes.

By rotating the threaded flange 67 by means of the handwheel 73, the gears that mesh with the threaded flanges 67 are moved along the threaded flange 67, causing the base element 5, which is coupled to the gears via the bearing washer 69, to move along with the flanges. It is thus possible to adjust the distance of the base element 5 from the handling unit. In the current embodiment, the distance can be varied freely over a length of 40 mm. In principle, the threaded flanges 67 can also be embodied as longer, thus enabling a greater adjusting range. The distance adjustment is carried out with the precision of $\frac{1}{100}$ mm.

This distance adjusting device 65 makes it possible to use different types of interface units 20, which must be situated different distances apart from the handling unit. With an exchange module 2 that is equipped with a distance adjusting device, it is thus possible for a wide variety of types of interface units to be quickly and easily exchanged and correctly positioned in adjusted with few movements.

The provision of the distance adjusting device 65 on an exchange module 2 having a mechanism for lifting the interface unit in a linear fashion from the end position into an intermediate position and having a device, e.g. the telescoping rails, for pulling out the interface unit constitutes an independent invention idea since it significantly increases the flexibility of the overall testing system and permits a wide variety of types of interface units to be used.

In the third exemplary embodiment explained above, the lever mechanism 10 is actuated by means of a single sliding guide that has a linear guide 45, 46 and a separate lever arm 47. In connection with the invention, it is naturally also possible to provide two sliding guides for respectively actuating the linear guide and the separate lever arm.

In the exemplary embodiments explained above, the two sliding guides 25, 58 are each driven in opposite directions by the drive belt. In connection with the invention, it is also possible for the two sliding guides to be driven in the same direction so that they each travel in the same direction at the same time, i.e. simultaneously toward the front lateral strut 6 or simultaneously toward the rear lateral strut. With an arrangement in which they travel in the same direction, the cam tracks in one sliding guide must be correspondingly reversed in mirror-image fashion.

Another exemplary embodiment with a lever mechanism 10 (FIGS. 21, 22) for an exchange module 2 is described below; the lever mechanism 10 is provided for a horizontal testing system for testing semiconductor components in which the exchange module is fastened to the underside of the testing unit 4.

The lever mechanism 10 corresponds approximately to the lever mechanism shown in the first exemplary embodiment. Parts that are the same have been provided with the same reference numerals.

Such a lever mechanism 10 is fastened to the inside of each of the longitudinal struts 8, 9. According to the fourth exemplary embodiment, the two lever mechanisms 10 are embodied in mirror-image fashion.

The lever mechanism 10 has a scissor joint with a first and second lever arm 11, 12.

One end of the first lever arm 11 is connected to the inside of the longitudinal strut 8, 9 by means of a stationary pivot joint 13. With its other end, the first lever arm 11 is connected to the telescoping rail 15 by means of the pivot joint 14. The pivot joint 14 is embodied as movable in the longitudinal direction of the telescoping rail 15.

Approximately in their longitudinal middle, the first and second lever arms 11, 12 are connected to a pivot joint 16 in a pivoting fashion.

One end of the second lever arm 12 is connected to the inside of the longitudinal strut 8, 9 by means of the pivot joint 17 that is movable in the longitudinal direction of the longitudinal strut 8, 9. The other end of the second lever arm 12 is connected to the telescoping rail 15 by means of another stationary pivot joint 18.

The two lever arms 11, 12 form a scissor joint. The scissor joint can be folded open or closed like a pair of scissors. During the folding open and closed of the scissor joint, the telescoping rail is lowered and raised relative to the base element 5. As this occurs, the telescoping rail 15 is always oriented parallel to the respective longitudinal strut 8, 9.

Since the two stationary pivot joints 13, 18 are situated opposite each other and the segments of the lever arms extending from the shared pivot joint 16 to the pivot joints 13, 14, 17, 18—with which the lever arms 11, 12 are connected to the base element 5 and the telescoping rail 15—are each the same length, the movement of the telescoping rail 15 is linear as the scissor joint is opened and closed, with the telescoping rail 15 and the respective longitudinal strut 8, 9 always oriented parallel to each other. The scissor joint thus constitutes a linear guide since it guides the telescoping rail 15 along a linear trajectory, without causing it to rock back and forth.

The two telescoping rails 15 support a holding frame 19 that forms a holder for holding an interface unit 20.

The lever mechanisms 10 are each coupled to a sliding guide 25. The sliding guide 25 is supported on the base element so that it can move in linear fashion. The sliding guide 25 of the present exemplary embodiment has a first cam track 26 and two second cam tracks 27. The first cam track 26 is referred to below as the pivoting cam track 26 and the second cam tracks are referred to as the locking cam tracks 27. The cam tracks 26, 27 are elongated recesses in the sliding guide 25 in which the lever arms 11, 12 respectively engage with a pivoting pin and locking pin 28. The engagement of the locking pins 28 with the cam tracks locks the free ends, i.e. the ends of the two lever arms 11, 12 connected to the pivot joints 14, 18, in position.

The locking pins 28 and the locking cam tracks 27 also immobilize the telescoping rails 15 and prevent the latter from bending. This is particularly advantageous because the exchange module that is fastened to the underside of the testing unit has a force exerted on it from below.

The two sliding guides 25, which in the present exemplary embodiment are embodied as mirror-symmetrical to a vertical plane of symmetry, are coupled to a deflecting linkage 75 at both ends. The two sliding guides are thus moved in the same direction when actuated. By moving the deflecting linkage 75, the two sliding guides can be moved in a linear fashion.

In lieu of the deflecting linkage 75, it is also possible to provide a toothed belt, a chain, or a cable. Then, however, the two deflecting linkages 75 are embodied as point symmetrical or asymmetrical.

The actuating lever 32, which is equipped with a detent mechanism, is provided for moving the deflecting linkage 75. The actuating lever 32 is coupled to a pinion that engages with the deflecting linkage 75 in a cogged fashion so that when the pinion is rotated by means of the actuating lever, this moves the deflecting linkage 75.

In lieu of the actuating lever 32, it is also possible to provide an automatic actuating device, e.g. a pneumatic lifting/piston mechanism, for moving the deflecting linkage 75.

Some of the exemplary embodiments described above are indicated as being preferably embodied and used for a horizontal testing system or for a vertical testing system for testing semiconductor components. In the context of the present invention, all exemplary embodiments can be used both for a horizontal testing system and for a vertical testing system for testing semiconductor components, even if they are specially embodied for a horizontal testing system or for a vertical testing system for testing semiconductor components.

The invention can be summarized briefly as follows:

The invention relates to a module for exchanging an approximately planar interface unit in a testing system for testing semiconductor elements. The module includes a base element, a holder, and guide elements. The guide elements are embodied so that the interface unit can be moved by means of a linear, translatory movement from an end position into an intermediate position and from the intermediate position into a removal position that is situated outside the testing system. The mechanism includes a lever mechanism that is controlled by a sliding guide and is supported so that it can move crosswise to the linear translation movement of the holder.

The module according to the invention therefore constitutes a drawer system that permits the interface unit to be moved quickly in and out; the linear movement into the end position ensures a safe, reliable insertion of the interface unit into the testing system so that positioning pins are correctly guided into corresponding positioning holes and protruding spring contact pins are not damaged.

REFERENCE NUMERAL LIST 1. testing system
2. module
3. handling unit
4. testing unit
5. base element
6. front lateral strut
7. rear lateral strut
8. right longitudinal strut
9. left longitudinal strut
10. lever mechanism
11. lever arm
12. lever arm
13. pivot joint
14. pivot joint
15. telescoping rail
16. pivot joint
17. pivot joint
18. pivot joint
19. holding frame
20. adapter
21. recess
22. projection
23. holding plate
24. positioning bushing
25. sliding guide
26. pivoting cam track
27. locking cam track
28. locking pin
29. drive belt
30. guide roller
31. bar
32. actuating lever
33. spring device
34. interface plane
35. carriage
36. rail
37. fastening block
38. pivoting pain
39. locking plate
40. locking segment
41. oblong hole
42. pin
43. wafer
44. connecting plate
45. long lever arm
46. short lever arm
47. separate lever arm
48. pivot joint (stationary)
49. pivot joint (movable)
50. pivot joint (stationary)
51. pivot joint
52. pivot joint (stationary)
53. pivot joint (movable)
54. oblong hole
55. pin
56. pivoting pin
57. pivoting pin
58. sliding guide
59. pivoting cam track
60. pivoting cam track
61. locking cam track
62. locking pin
63. handle
64. small plate
65. distance adjusting device
66. distance adjusting element
67. threaded flange
68. gear
69. bearing washer
70. drive belt
71. guide roller
72. bar
73. handwheel
74. pre-centering pin
75. deflecting linkage

The invention claimed is:

1. A module for exchanging an approximately planar interface unit in a testing system for testing semiconductor elements, comprising:
    a base element that can be fastened to the testing system;
    a holder for accommodating an interface unit; and
    guide elements with which the holder is fastened to the base element in such a way that the holder can be moved between an end position on the base element and a removal position;
    wherein in the end position, the interface element is situated in an interface plane, and wherein the guide elements guide the holder along a predetermined trajectory and include:
at least one lever mechanism that is designed at least for guiding a linear translation movement of the holder a certain distance in a direction perpendicular to the interface plane starting from the end position,
at least one sliding guide that engages the lever mechanism in order to actuate it, with the sliding guide being supported so that it is able to move in a direction crosswise to the linear translation movement of the holder, and
an actuating means for moving the sliding guide so that the lever mechanism is actuated.

2. The module according to claim 1, wherein the sliding guide is embodied to lock the lever mechanism in the end position.

3. The module according to claim 1, wherein two lever mechanisms are provided, which engage opposite respective sides of the holder and can each be actuated by means of the sliding guide.

4. The module according to claim 2, wherein two lever mechanisms are provided, which engage opposite respective sides of the holder and can each be actuated by means of the sliding guide.

5. The module according to claim 1, wherein the actuating means for moving the sliding guide is a drive belt or a rod mechanism.

6. The module according to claim 4, wherein the actuating means for moving the sliding guide is a drive belt or a rod mechanism.

7. The module according to claim 1, wherein:
the lever mechanism has at least one lever arm whose one end is fastened to the base element in pivoting fashion and whose other end is fastened to the holder in pivoting fashion;
the sliding guide is provided with a cam track that engages with a pivoting pin situated on this lever arm in order, through a movement of the sliding guide, to control a pivoting motion of the lever relative to the base element; and
the lever arm has a locking pin, which is situated farther away from the end of the lever arm fastened to the base element than the pivoting pin, and engages with another locking cam track on the sliding guide, at least in the end position.

8. The module according to claim 6, wherein:
the lever mechanism has at least one lever arm whose one end is fastened to the base element in pivoting fashion and whose other end is fastened to the holder in pivoting fashion;
the sliding guide is provided with a cam track that engages with a pivoting pin situated on this lever arm in order, through a movement of the sliding guide, to control a pivoting motion of the lever relative to the base element; and
the lever arm has a locking pin, which is situated farther away from the end of the lever arm fastened to the base element than the pivoting pin and engages with another locking cam track on the sliding guide, at least in the end position.

9. The module according to claim 7, wherein:
the lever mechanism has at least one lever arm whose one end is fastened to the base element in pivoting fashion and whose other end is fastened to the holder in pivoting fashion;
the sliding guide is provided with a cam track that engages with a pivoting pin situated on this lever arm in order, through a movement of the sliding guide, to control a pivoting motion of the lever relative to the base element; and
a locking pin is situated on the lever or on another part of guide elements or on the holder and another locking cam track is situated on the sliding guide, which engages with the locking pin at least in the end position.

10. The module according to claim 8, wherein:
the lever mechanism has at least one lever arm whose one end is fastened to the base element in pivoting fashion and whose other end is fastened to the holder in pivoting fashion;
the sliding guide is provided with a cam track that engages with a pivoting pin situated on this lever arm in order, through a movement of the sliding guide, to control a pivoting motion of the lever relative to the base element; and
a locking pin is situated on the lever or on another part of guide elements or on the holder and another locking cam track is situated on the sliding guide, which engages with the locking pin at least in the end position.

11. The module according to claim 7, wherein:
the cam tracks are embodied as inclined relative to the interface plane; and
the cam tracks each have a respective locking segment in which the respective pins are situated in the end position, which segment has a more gradual inclination relative to the interface plane than the remaining segment of the cam track.

12. The module according to claim 10, wherein:
the cam tracks are embodied as inclined relative to the interface plane; and
the cam tracks each have a respective locking segment in which the respective pins are situated in the end position, which segment has a more gradual inclination relative to the interface plane than the remaining segment of the cam track.

13. The module according to claim 1, wherein the holder is a holding frame.

14. The module according to claim 12, wherein the holder is a holding frame.

15. The module according to claim 1, wherein:
the lever mechanism has at least one linear guide and one lever arm that is independent of the linear guide, each of which connects the base element to the holder; and
both the linear guide and the independent, separate lever arm have a pivoting pin, each of these pivoting pins engages in a respective cam track of the sliding guide.

16. The module according to claim 14, wherein:
the lever mechanism has at least one linear guide and one lever arm that is independent of the linear guide, each of which connects the base element to the holder; and
both the linear guide and the independent, separate lever arm have a pivoting pin, each of these pivoting pins engages in a respective cam track of the sliding guide.

17. The module according to claim 15, wherein the cam tracks are shaped so that the holder, starting from the end position, first executes a linear translatory movement and after having reached a predetermined distance of the interface unit from the end position, then executes a pivoting movement.

18. The module according to claim 17, wherein the cam tracks are shaped so that the holder, starting from the end position, first executes a linear translatory movement and after having reached a predetermined distance of the interface unit from the end position, then executes a pivoting movement.

19. The module according to claim 1, wherein the guide elements have a device for pulling out the holder approximately crosswise to the linear translation movement, which allows the holder to be moved from an intermediate position to the removal position.

20. The module according to claim 18, wherein the guide elements have a device for pulling out the holder approximately crosswise to the linear translation movement, which allows the holder to be moved from an intermediate position to the removal position.

21. The module according to claim 19, further comprising a locking device for locking the holder in such a way that it cannot be moved crosswise to the linear translation movement if the holder is not in the region extending from the intermediate position to the removal position.

22. The module according to claim 20, further comprising a locking device for locking the holder in such a way that it cannot be moved crosswise to the linear translation movement if the holder is not in the region extending from the intermediate position to the removal position.

23. A testing system for testing semiconductor elements, having a handling unit and a testing unit, wherein a module according to claim 1 is situated in the region between the handling unit and the testing unit.

\* \* \* \* \*